United States Patent
Ueda et al.

(10) Patent No.: US 9,105,473 B2
(45) Date of Patent: Aug. 11, 2015

(54) FIELD EFFECT TRANSISTOR, DISPLAY ELEMENT, IMAGE DISPLAY DEVICE, AND SYSTEM

(75) Inventors: Naoyuki Ueda, Kanagawa (JP); Yuki Nakamura, Tokyo (JP); Yuji Sone, Kanagawa (JP); Yukiko Abe, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 76 days.

(21) Appl. No.: 13/578,782

(22) PCT Filed: Feb. 15, 2011

(86) PCT No.: PCT/JP2011/053603
§ 371 (c)(1),
(2), (4) Date: Aug. 13, 2012

(87) PCT Pub. No.: WO2011/102500
PCT Pub. Date: Aug. 25, 2011

(65) Prior Publication Data
US 2012/0306834 A1    Dec. 6, 2012

(30) Foreign Application Priority Data
Feb. 16, 2010  (JP) .................................. 2010-031610
Feb. 2, 2011  (JP) .................................. 2011-021155

(51) Int. Cl.
*H01L 29/94*    (2006.01)
*H01L 21/02*    (2006.01)
(Continued)

(52) U.S. Cl.
CPC .... *H01L 21/02565* (2013.01); *H01L 21/02576* (2013.01); *H01L 21/02631* (2013.01); *H01L 29/7869* (2013.01); *H01L 27/1225* (2013.01); *H01L 27/3262* (2013.01)

(58) Field of Classification Search
CPC ................... H01L 21/02554; H01L 21/02565; H01L 29/365; H01L 29/7869; H01L 27/1225; H01L 27/3262; A01B 12/006
See application file for complete search history.

(56) References Cited

U.S. PATENT DOCUMENTS 5,622,653 A  *  4/1997  Orita et al. .................. 252/519.1
7,601,984 B2    10/2009  Sano et al.
(Continued)

FOREIGN PATENT DOCUMENTS

JP    2002 76356        3/2002
JP    2004-103957 A     4/2004
(Continued)

OTHER PUBLICATIONS

Eric N. Dattoli, Qing Wan, Wei Guo, Yanbin Chen, Xiaoping Pan and Wei Lu, Fully Transparent Thin-Film Transistor Devices Based on SnO2 Nanowires, Nano Letters, vol. 7, No. 8, 2463-2469 (2007).*
(Continued)

*Primary Examiner* — Matthew W Such
*Assistant Examiner* — Stephen C Smith
(74) *Attorney, Agent, or Firm* — Oblon, McClelland, Maier & Neustadt, L.L.P.

(57) ABSTRACT

A disclosed field effect transistor includes a gate electrode to which a gate voltage is applied, a source electrode and a drain electrode for acquiring a current in response to the gate voltage, an active layer provided adjacent to the source electrode and the drain electrode, the active layer being formed of an n-type oxide semiconductor, and a gate insulator layer provided between the gate electrode and the active layer. In the field effect transistor, the n-type oxide semiconductor is formed of an n-type doped compound having a chemical composition of a crystal phase obtained by introducing at least one of a trivalent cation, a tetravalent cation, a pentavalent cation and a hexavalent cation.

38 Claims, 14 Drawing Sheets

(51) Int. Cl.
*H01L 29/786* (2006.01)
*H01L 27/12* (2006.01)
*H01L 27/32* (2006.01)

(56) References Cited

U.S. PATENT DOCUMENTS

| | | | |
|---|---|---|---|
| 7,982,216 B2 | 7/2011 | Imai | |
| 7,994,500 B2* | 8/2011 | Kim et al. | 257/43 |
| 8,274,082 B2* | 9/2012 | Ferra De Paiva Martins et al. | 257/59 |
| 8,283,666 B2* | 10/2012 | Kim et al. | 257/57 |
| 8,333,913 B2* | 12/2012 | Inoue et al. | 252/521.1 |
| 8,641,930 B2* | 2/2014 | Yano et al. | 252/518.1 |
| 2005/0039670 A1 | 2/2005 | Hosono et al. | |
| 2006/0163676 A1* | 7/2006 | Shimizu et al. | 257/410 |
| 2008/0237595 A1 | 10/2008 | Park et al. | |
| 2009/0001360 A1 | 1/2009 | Nakayama | |
| 2009/0283762 A1 | 11/2009 | Kimura | |
| 2010/0224916 A1* | 9/2010 | Shimizu et al. | 257/288 |
| 2010/0244029 A1* | 9/2010 | Yamazaki et al. | 257/52 |
| 2010/0295042 A1* | 11/2010 | Yano et al. | 257/43 |
| 2011/0006299 A1 | 1/2011 | Abe et al. | |
| 2011/0049511 A1* | 3/2011 | Yano et al. | 257/43 |
| 2011/0128275 A1 | 6/2011 | Ueda et al. | |
| 2012/0288715 A1* | 11/2012 | Griebler et al. | 428/402 |

FOREIGN PATENT DOCUMENTS

| | | |
|---|---|---|
| JP | 2006 165529 | 6/2006 |
| JP | 2007-41260 A | 2/2007 |
| JP | 2007 96055 | 4/2007 |
| JP | 2008 252097 | 10/2008 |
| JP | 2008-311342 | 12/2008 |
| JP | 2009 31761 | 2/2009 |
| JP | 2009 141341 | 6/2009 |
| JP | 2009 302520 | 12/2009 |
| JP | 2010 15092 | 1/2010 |
| JP | 2010 74148 | 4/2010 |
| JP | 2011 35376 | 2/2011 |
| WO | 2008 096768 | 8/2008 |
| WO | WO 2008/126492 A1 | 10/2008 |

OTHER PUBLICATIONS

Nomura, K., et al., "Room-temperature fabrication of transparent flexible thin-film transistors using amorphous oxide semiconductors," Nature, vol. 432, No. 25, pp. 488-492, (Nov. 2004).

Park, J.S., et al., "Novel ZrInZnO Thin-film Transistor with Excellent Stability," Advanced Materials, vol. 21, No. 3, pp. 329-333, (2009).

Office Action issued Jul. 31, 2014, in Korean Patent Application No. 10-2014-7014532.

H. Kawazoe, et al., Transparent Conducting Oxides Based on the Spinel Structure, Journal of the American Ceramic Society, vol. 82, No. 12, pp. 3330-3336, Dec. 1999.

Office Action issued Aug. 22, 2014, in Chinese Patent Application No. 201180019311.7, filed Feb. 15, 2011 (w/English translation).

Office Action issued Dec. 16, 2014 in Japanes Patent Application No. 2011-021155.

* cited by examiner

FIG.4
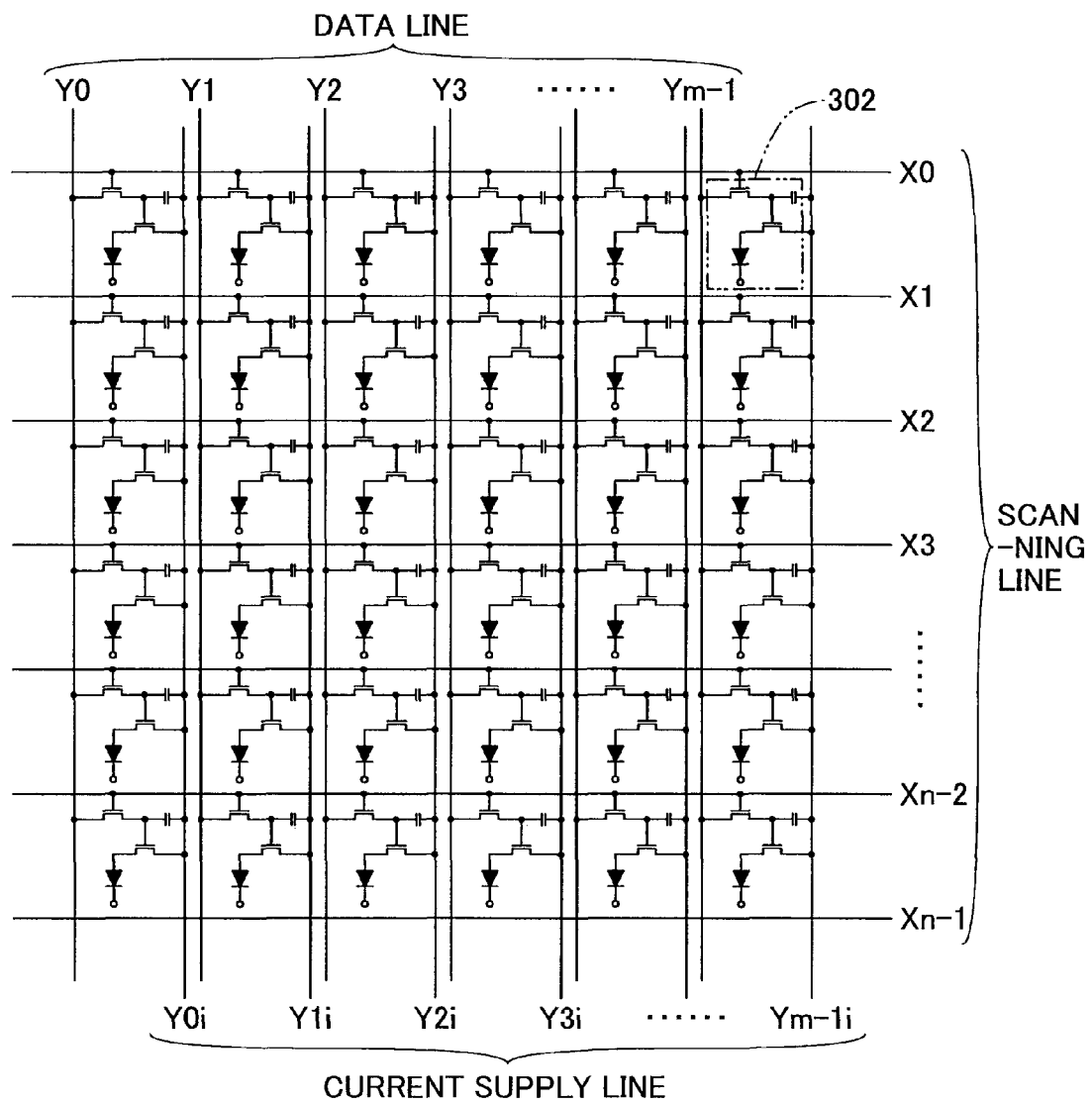
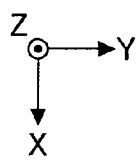

LIGHT

FIELD EFFECT TRANSISTOR, DISPLAY ELEMENT, IMAGE DISPLAY DEVICE, AND SYSTEM

TECHNICAL FIELD

The present invention generally relates to a field effect transistor, a display element, an image display device, and a system. More particularly, the present invention relates to a field effect transistor having an active layer formed of an oxide semiconductor, a display element having the field effect transistor and an image display device having the display element, and a system having the image display device.

BACKGROUND ART

A field effect transistor (FET) is a transistor for controlling a current flowing between a source electrode and a drain electrode by applying a voltage to a gate electrode to provide a gate for the flow of electrons or holes based on an electric field of a channel.

An FET has been used as a switching element or an amplifying element due to its characteristics. Since an FET shows a small gate current and has a flat profile, it can be easily manufactured or integrated compared to a bipolar transistor. Therefore, an FET is an indispensable element in an integrated circuit used in current electronic devices.

An FET has been applied as a thin film transistor (TFT) in an active matrix type display.

In recent years, liquid crystal displays, organic EL (electroluminescent) displays, electronic paper, and the like have been made into practical use as flat panel displays (FPDs).

FPDs are driven by a driver circuit including a TFT having an active layer formed of amorphous silicon or polycrystalline silicon. There is demand for FPDs to achieve further enlargement, higher definition, and a higher driving speed. In accordance with these demands, TFTs having higher carrier mobility, less characteristic change over time, and less inter-element characteristic variations in a panel have been demanded.

TFTs having an active layer formed of amorphous silicon (a-Si) or polycrystalline silicon (particularly low temperature polycrystalline silicon (LIPS)) have advantages and disadvantages. Therefore, it has been difficult to satisfy all the demands at the same time.

For example, a-Si TFT has disadvantages of insufficient mobility for driving a large screen LCD (Liquid Crystal Display) at a high speed, and a large shift of a threshold voltage in continuous driving. Although LTPS-TFTs have high mobility, they have a disadvantage in that threshold voltages largely vary due to a process for crystallizing an active layer by annealing using an excimer laser; therefore, a large-sized mother glass for the mass production line may not be used.

Thus, there is a demand for a novel TFT technology having combined advantages of a-Si TFT and LTPS-TFT. To satisfy these demands, a TFT formed by using an oxide semiconductor, in which higher carrier mobility than amorphous silicon (a-Si) is expected, has been actively developed.

Specifically, after Nomura et. al. disclosed a TFT formed by using an amorphous InGaZnO4 (a-IGZO) capable of being deposited at room temperature and exhibiting higher carrier mobility than amorphous silicon (a-Si) in NATURE (K. Nomura et. al., "Room-temperature fabrication of transparent flexible thin-film transistors using amorphous oxide semiconductors", NATURE, VOL. 432, No. 25, November, 2004, p. 488-492; hereinafter referred to as "Non-Patent Document 1"), numerous studies on an amorphous oxide semiconductor having high carrier mobility have been extensively carried out.

However, in such amorphous oxide semiconductors, carrier electrons are generated by oxygen vacancy. Thus, oxygen concentration needs in a deposition process needs to be rigorously controlled. The TFT characteristics of the amorphous oxide semiconductor may easily result in a depletion mode when attempting to achieve high mobility. In addition, a process window may be too narrow to achieve a normally-off characteristic. Further, since oxide concentration in a film is changed in a patterning process or a passivation process after the deposition process of the active layer, the TFT characteristics may be degraded due to characteristic change of the oxide semiconductor.

In related art technologies, countermeasures of such drawbacks have been attempted in two aspects. For example, Japanese Patent Application Publication No. 2002-76356 (hereinafter also referred to as "Patent Document 1") and Japanese Patent Application Publication No. 2006-165529 (hereinafter also referred to as "Patent Document 2") disclose examples of such countermeasures. A first example is a method in which carriers generated due to oxide vacancy are compensated for by introducing a p-type dopant. A second example is a method disclosed by J. S. Park et al. in Advanced Materials (J. S. Park et al., "Novel ZrInZnO Thin-film Transistor with Excellent Stability", Advanced Materials, VOL. 21, No. 3, 2009, p. 329-333; hereinafter also referred to as "Non-Patent Document 2"). In the second example, carrier generation is controlled by introducing a certain amount of a metallic element (e.g., Al, Zr, and Hf) having high affinity to oxygen. However, the above methods also have drawbacks such as insufficient stability and reduction in carrier mobility.

SUMMARY OF THE INVENTION

Accordingly, it is a general object of the present invention to provide a novel and useful field effect transistor capable of generating carriers by introducing n-type substitutional doping in an active layer formed of oxide semiconductor, sufficiently introducing oxygen in a forming process without rigorous oxygen amount control, and enhancing stability in lattice by lowering oxygen vacancy to achieve high characteristic stabilities in a later process, a display element, an image display device, and a system.

In one embodiment, there is provided a field effect transistor including a gate electrode to which a gate voltage is applied; a source electrode and a drain electrode for acquiring a current in response to the gate voltage; an active layer provided adjacent to the source electrode and the drain electrode, the active layer being formed of an n-type oxide semiconductor; and a gate insulator layer provided between the gate electrode and the active layer. In the field effect transistor, the n-type oxide semiconductor is formed of an n-type doped compound having a chemical composition of a crystal phase obtained by introducing at least one of a trivalent cation, a tetravalent cation, a pentavalent cation and a hexavalent cation.

In one embodiment, there is provided a display element including an optical control element configured to control an optical output based on a driving signal; the field effect transistor described above; and a drive circuit configured to drive the optical control element.

In one embodiment, there is provided an image display device for displaying images based on image data. The image display device includes: a plurality of the display elements described above; plural wires configured to individually apply gate voltages to a plurality of the field effect transistors in the display elements arranged in the matrix; and a display control device configured to separately control the gate voltages of the field effect transistors via the wires based on the image data.

In one embodiment, there is provided a system including the image display device described above; and an image data generating device configured to generate the image data based on image information to be displayed and output the generated image data to the image display device.

BRIEF DESCRIPTION OF DRAWINGS

Other objects and further features of embodiments will become apparent from the following detailed description when read in conjunction with the accompanying drawings, in which:

FIG. 4 is a diagram (part 3) illustrating the image display device illustrated in FIG. 1;

BEST MODE FOR CARRYING OUT THE INVENTION

Figure 1:
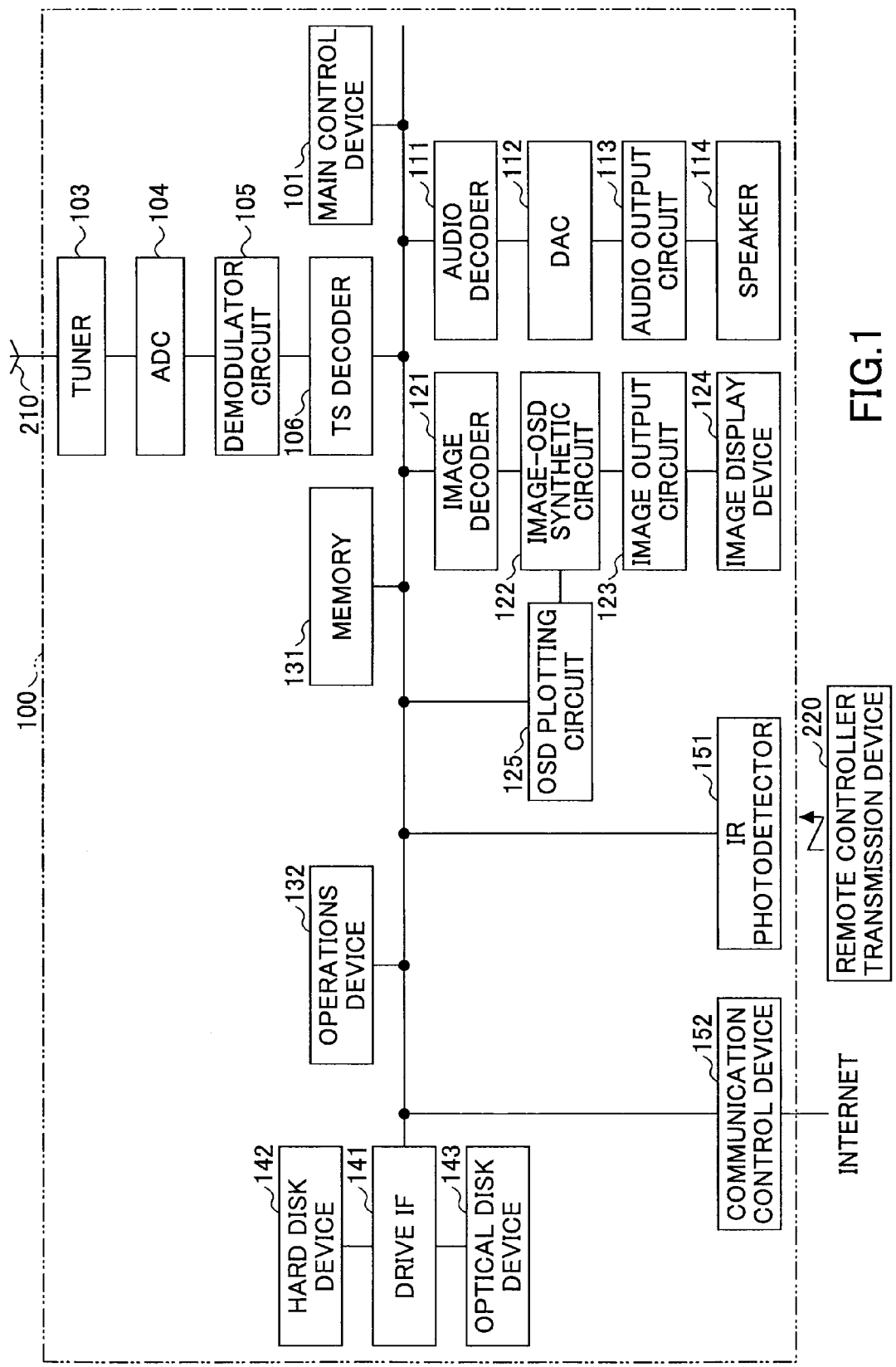
FIG. 1 is a block diagram illustrating a configuration of a television apparatus according to an embodiment.

In the following, preferred embodiments will be described with reference to FIGS. 1 through 12. FIG. 1 is a schematic configuration diagram illustrating a television apparatus 100 according to an embodiment. Note that connecting lines illustrated in FIG. 1 indicate a typical signal or information flow and not all connecting relations between blocks are illustrated.

The television apparatus 100 (i.e., a system) includes a main control device 101, a tuner 103, an AD converter (ADC) 104, a demodulator circuit 105, a transport stream (TS) decoder 106, an audio decoder 111, a DA converter (DAC) 112, an audio output circuit 113, a speaker 114, an image decoder 121 (i.e., a part of image data generation device), an image-OSD synthetic circuit 122 (i.e., a part of an image data generation device), an image output circuit 123 (i.e., a part of the image data generation device), an image display device 124, an OSD plotting circuit 125 (i.e., a part of the image data generation device), a memory 131, an operations device 132, a drive interface (drive IF) 141, a hard disk device 142, an optical disk device 143, an IR photodetector 151, and a communication control device 152.

The main control device 101 includes a CPU, a flash ROM and a RAM, and is configured to control the overall television apparatus 100. The flash ROM stores computer programs written in appropriate codes readable by the CPU, and various data used in CPU processing. The RAM is used as a working memory.

The tuner 103 is configured to select a broadcast based on a predetermined channel from broadcast waves received via an antenna 210.

The ADC 104 is configured to convert an output signal (analog information) from the tuner 103 into digital information.

The demodulator circuit 105 is configured to demodulate the digital information from the ADC 104.

The TS decoder 106 is configured to TS decode an output signal (digital information) from the demodulator circuit 105 to separate audio information and image information contained in the output signal.

The audio decoder 111 is configured to decode the audio information acquired from the TS decoder 106.

The DA converter (DAC) 112 is configured to convert an output signal (digital information) from the audio decoder 111 into analog information.

The audio output circuit 113 is configured to output an output signal (analog information) acquired from the DA converter (DAC) 112 to the speaker 114.

The image decoder 121 is configured to decode the image information acquired from the TS decoder 106.

The image-OSD synthetic circuit 122 is configured to synthesize an output signal acquired from the image decoder 121 and an output signal acquired from the OSD plotting circuit 125.

The image output circuit 123 is configured to output a synthesized output signal acquired from the image-OSD synthetic circuit 122 to the image display device 124.

The OSD plotting circuit 125 includes a character generator for displaying characters and graphics on a screen of the image display device 124 and is configured to generate a signal containing display information based on an instruction from the operations device 132 or the IR photodetector 151.

The memory 131 temporarily accumulates Audio-Visual (AV) data.

The operations device 132 includes an input medium (not shown) such as a control panel to report various information items input by a user to the main control device 101.

The drive IF 141 is a bidirectional communication interface which complies with ATAPI (AT Attachment Packet Interface) or the like.

The hard disk device 142 includes a hard disk and a drive device for driving the hard disk. The drive device is configured to record data in the hard disk and reproduce the recorded data from the hard disk.

The optical disk device 143 is configured to record data in an optical disk (e.g., DVD) and retrieve the recorded data from the optical disk.

The IR photodetector 151 is configured to receive an optical signal from a remote controller transmission device 220 and report the reception to the main control device 101.

The communication control device 152 is configured to control communications with the Internet. The communication control device 152 is configured to acquire various pieces of information via the Internet.

Figure 2:
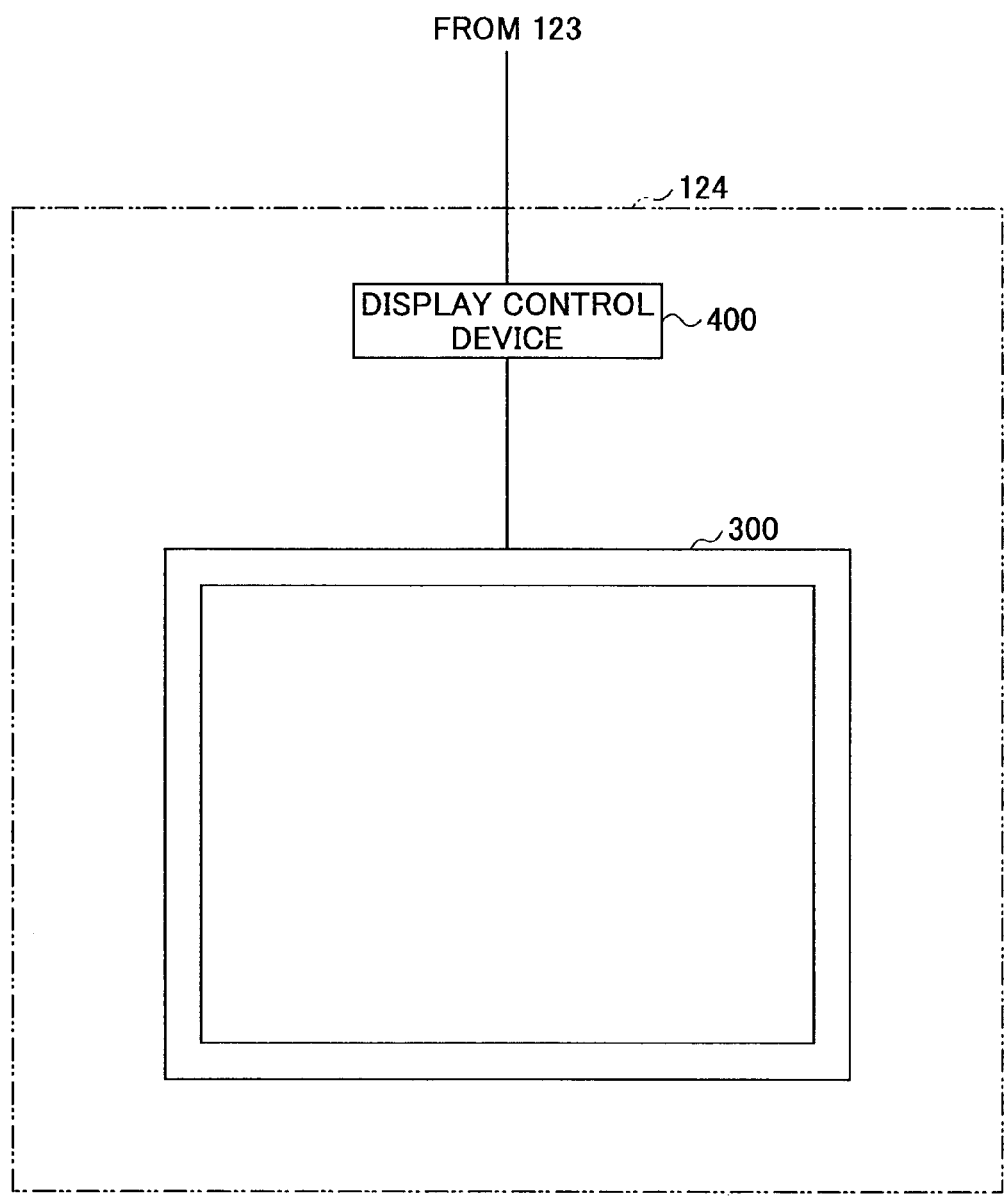
FIG. 2 is a diagram (part 1) illustrating an image display device illustrated in FIG. 1.

The image display device 124 may include a display device 300 and a display control device 400 as illustrated as an example in FIG. 2.

Figure 3:
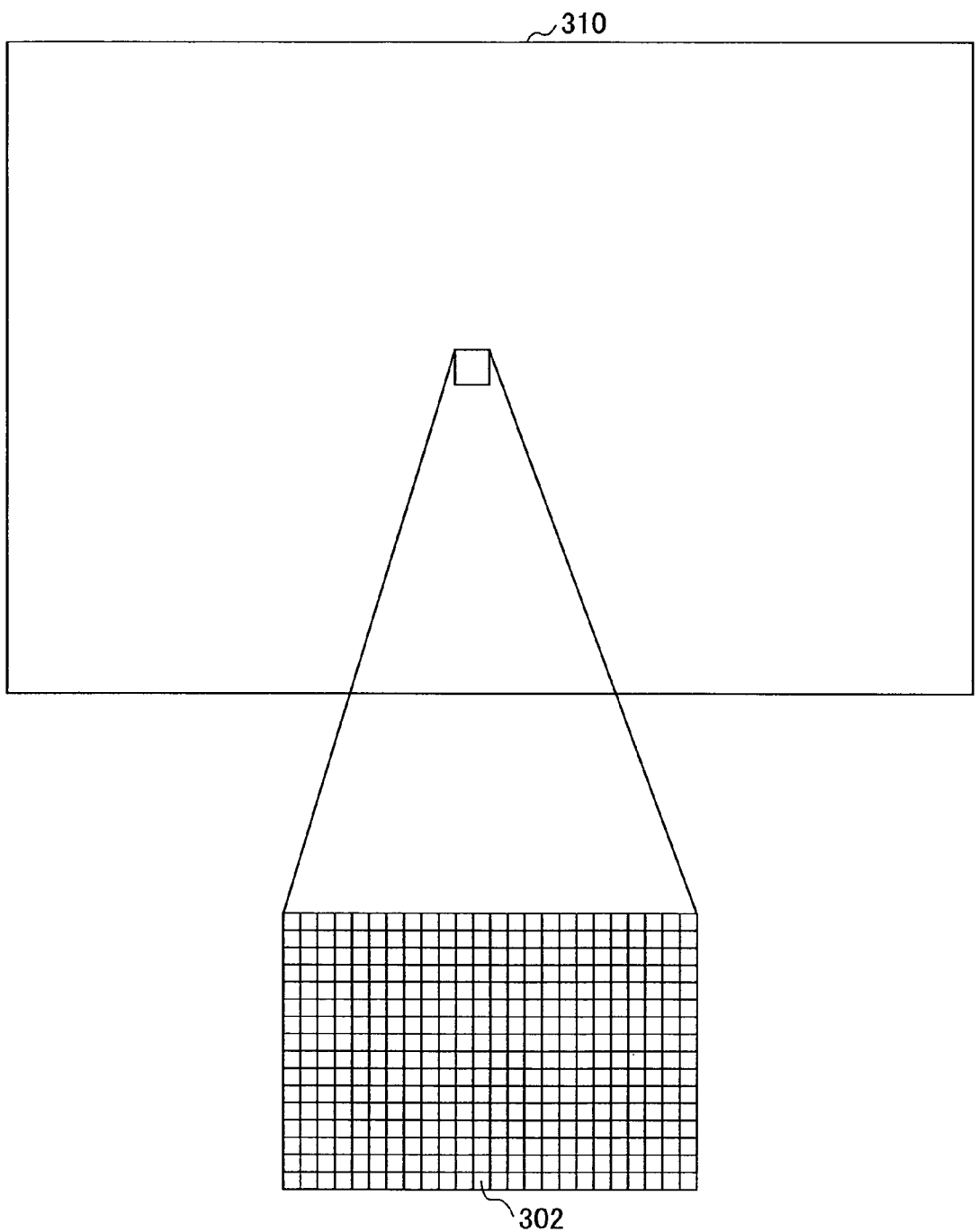
FIG. 3 is a diagram (part 2) illustrating the image display device illustrated in FIG. 1.

As illustrated as an example in FIG. 3, the display device 300 may include a display 310 composed of plural (i.e., n*m elements) display elements 302 arranged in a matrix.

As illustrated an example in FIG. 4, the display 310 includes n scanning lines (X0, X1, X2, X3, ..., Xn-2, Xn-1) arranged at equal intervals along an X-axis direction, m data lines (Y0, Y1, Y2, Y3, ..., Ym-1) arranged at equal intervals along a Y-axis direction, and m current supply lines (Y0$i$, Y1$i$, Y2$i$, Y3$i$, ..., Ym-1$i$) arranged at equal intervals along the Y-axis direction. A display element is specified by a scanning line and a data line.

Figure 5:
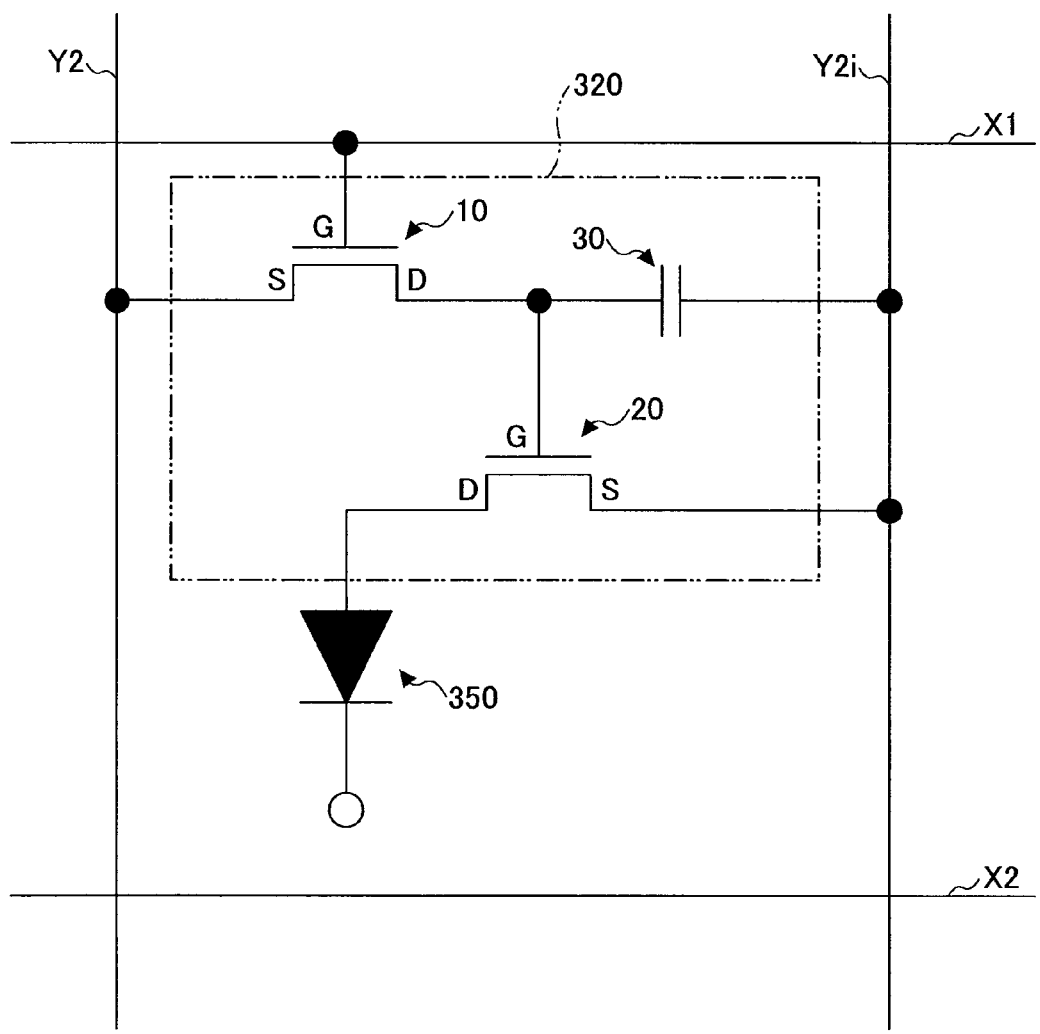
FIG. 5 is a diagram illustrating a display element.

As illustrated as an example in FIG. 5, each display element includes an organic EL (electroluminescence) element 350 (i.e., optical control element) and a drive circuit 320 for illuminating the organic EL element 350. That is, the display 310 is an active matrix organic EL display. The display 310 is a 32-inch color display. Note that the display 310 is not limited to the 32-inch color display.

Figure 6:
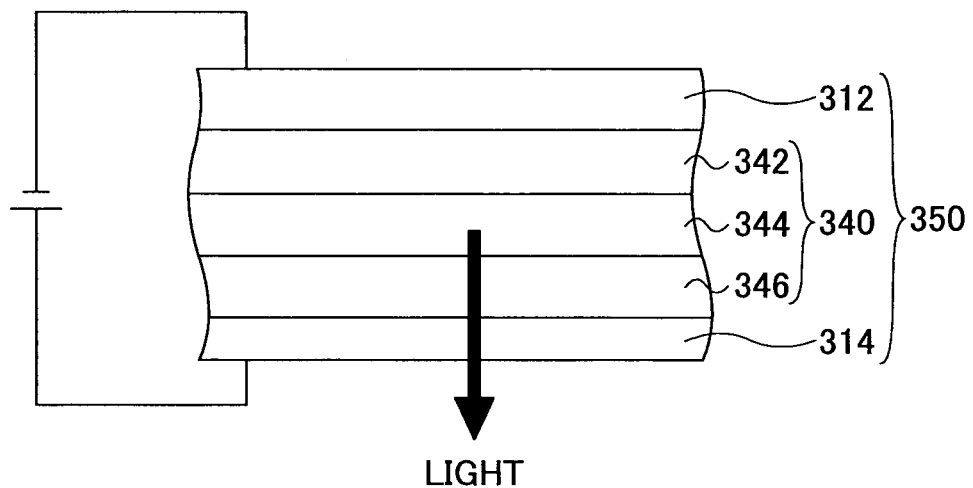
FIG. 6 is a diagram illustrating an organic EL element.

As illustrated as an example in FIG. 6, the organic EL element 350 includes an organic EL thin film layer 340, a cathode 312, and an anode 314.

The cathode 312 includes aluminum (Al). Note that the cathode 312 may include magnesium (Mg)-silver (Ag) alloy, aluminum (Al)-Lithium (Li) alloy, and ITO (Indium Tin Oxide).

The anode 314 includes ITO (Indium Tin Oxide). Note that the anode 314 may include silver (Ag)-neodymium (Nd) alloy, and conductive oxides such as IZO (Indium Zinc Oxide).

The organic EL thin film layer 340 includes an electron transport layer 342, an emitting layer 344 and a hole transport layer 346. The electron transport layer 342 is connected to the cathode 312 and the hole transport layer 346 is connected to the anode 314. The emitting layer 344 emits light by applying a predetermined voltage between the anode 314 and the cathode 312.

Referring back to FIG. 5, the drive circuit 320 includes two field effect transistors 10 and 20 (hereinafter also referred to as a "first field effect transistor 10" and a "second field effect transistor 20"), and a capacitor 30.

The first field effect transistor 10 is operated, as a switching element. A gate electrode G of the first field effect transistor 10 is connected to a predetermined scanning line and a source electrode S of the first field effect transistor 10 is connected to a predetermined data line. A drain electrode D of the first field effect transistor 10 is connected to a terminal of the capacitor 30.

The capacitor 30 is configured to store data, specifically to store a status of the first field effect transistor 10. The other terminal of the capacitor 30 is connected to a predetermined current supply line.

The second field effect transistor 20 is configured to supply a large amount of current to the organic EL element 350. A gate electrode G of the second field effect transistor 20 is connected to a drain electrode D of the first field effect transistor 10. A drain electrode D of the second field effect transistor 20 is connected to an anode 314 of the organic EL element 350 and a source electrode S of the second field effect transistor 20 is connected to a predetermined current supply line.

When the first field effect transistor 10 is an "ON" status, the second field effect transistor 20 drives the organic EL element 350.

Figure 7:
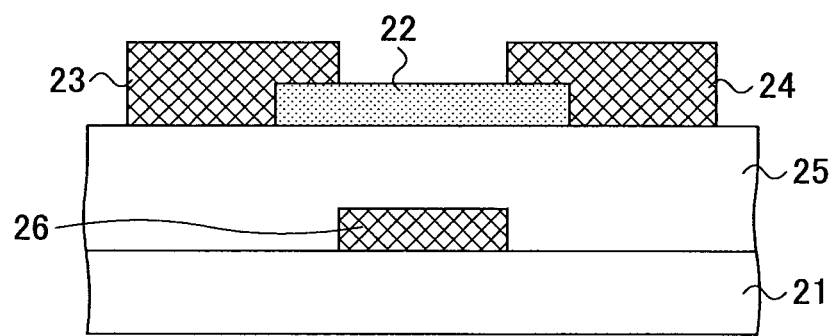
FIG. 7 is a diagram illustrating a field effect transistor.

As illustrated as an example in FIG. 7, the first and second field effect transistors each includes a substrate 21, an active layer 22, a source electrode 23, a drain electrode 24, a gate insulator layer 25, and a gate electrode 26.

The example in FIG. 7 illustrates a so-called "top-contact/bottom-gate type" field effect transistor; however, the first and second field effect transistors may include other configurations such as a "top-gate type" and "coplanar type".

Next, an example of a fabrication method of the above field effect transistors is described.

First, the substrate 21 is prepared. Examples of a material for the substrate 21 includes a plastic substrate made of polycarbonate (PC), polyimide (PI), polyethylene terephthalate (PET), and polyethylene naphthalate (PEN) in addition to alkali-free glass and silica glass widely used in flat panel displays. Note that it is preferable to carry out preliminary treatment, such as oxygen plasma cleaning, UV ozone cleaning or UV irradiation cleaning, on the substrate 21 for cleaning a surface or improving adhesive properties of the substrate 21.

Next, the gate electrode 26 is formed on the substrate 21. The gate electrode 26 may be made of various materials, may be formed in various processes and may be formed by various patterning methods. Examples of the material for the gate electrode 26 include metal such as Mo, Al, and Cu or alloys of such metals, transparent conducting oxides such as ITO and ATO, organic conductors such as polyethylenedioxythiophene (PEDOT) and polyaniline (PANI). The gate electrode 26 may be formed by a deposition process by sputtering or dip coating and then patterning the deposited film by photolithography; or directly depositing on a substrate with a predetermined shape by a printing process such as ink-jet printing, nanoimprint lithography, or gravure printing.

Next, the gate insulator film 25 is formed over the gate electrode 26. The gate insulator film 25 may be made of various materials, may be formed in various processes and may be formed by various patterning methods. Examples of a material for the gate insulator film 25 includes $SiO_2$ or $SiN_x$ widely used in mass production, a high dielectric constant material such as $La_2O_3$ or $HfO_2$, or an organic material such as polyimide (PI) and fluorine resin. The gate insulator film 25 may be formed by a sputtering process, chemical vapor deposition (CVD) and atomic layer deposition (ALD), or a solution process such as spin coating, die coating, or an ink-jet process.

Next, the active layer 22 is formed on the gate insulator layer 25. The active layer 22 may be formed by any method such as a sputtering process, a pulse-laser deposition (PLD) process, chemical vapor deposition (CVD) and atomic layer deposition (ALD), or a printing process such as dip coating, ink-jet process, and nanoimprint lithography.

The active layer 22 may be formed of an n-type doped oxide semiconductor that is made of an compound having a chemical composition of a crystal phase (hereafter denoted by 'a crystal compound') obtained by introducing at least one of a trivalent cation, a tetravalent cation, a pentavalent cation and a hexavalent cation.

Examples of the crystal compound includes, but not limited to, the cubic compound, the tetragonal compound, the orthorhombic compound, and the hexagonal compound.

Examples of the cubic compound includes, but not limited to, a spinel compound, a bixbite compound, a pyrochlore compound, and a fluorite compound.

The first candidate example used as a material for the active layer 22 is a spinel compound represented by $AB_2O_4$ where A is one or more divalent cations including $Mg^{2+}$, $Zn^{2+}$, and $Cd^{2+}$, and B is one or more trivalent cations including $Al^{3+}$, $Ga^{3+}$, and $In^{3+}$. In the first candidate spinel compound, n-type doping may be carried out by introducing one or more types of cations including $Al^{3+}$, $Ga^{3+}$, $In^{3+}$, $Ge^{4+}$, $Sn^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$ into one or more divalent cations represented by A. Examples of the spinel compound in a parent phase include $MgGa_2O_4$, $MgIn_2O_4$, $ZnAl_2O_4$, $ZnGa_2O_4$, and $CdGa_2O_4$. These compounds may be in solid solution. In the spinel compound, the composition is indicated by integers; however, unexpected non-stoichiometry or small amounts of impurities may be acceptable insofar as they do not interfere with the doping. Specifically, oxygen vacancy is easily generated so that the number of oxygen in a composition is less than 4 in general. Trivalent cations including $Al^{3+}$, $Ga^{3+}$, and $In^{3+}$, tetravalent cations including $Ge^{4+}$, $Sn^{4+}$, $Ti^{4+}$, $Zr^{4+}$, and $Hf^{4+}$, pentavalent cations including $V^{5+}$, $Nb^{5+}$, $Ta^{5+}$, and $Sb^{5+}$, and hexavalent cations including $Mo^{6+}$ and $W^{6+}$ may be used, as the n-type doping to be carried out on the divalent cations including $Mg^{2+}$, $Zn^{2+}$, and $Cd^{2+}$. These dopants may be used in combination of two or more for carrying out the n-type doping. The dopant may be selected based on an ion radius, a coordination number, and orbital energy. Doping concentration may appropriately be selected based on a material of a parent phase, a substituting site of the dopant, types of the dopant, a deposition process, and desired TFT characteristics. For example, when an Al-doped $MgIn_2O_4$ film is formed by sputtering, a target (raw material of deposition) doped at approximately 1% Al is prepared. The target is conductive so that the target may be DC sputtered. Al substituting for Mg site forms a donor. Accordingly, oxygen vacancy may be reduced by increasing oxygen concentration of a sputtering gas at a level higher than the oxygen concentration level in forming non-doped $MgIn_2O_4$. In addition, since the Al substitution may maintain the carrier concentration at the higher oxygen concentration level, and keep a low contact resistance between the source and drain electrodes and the active layer, lowering of the carrier mobility may be suppressed. Further, since the active layer is deposited through an highly excited state during the sputtering process, carriers may be generated without heating the substrate. Even if a diffraction line is not observed by the X-ray diffraction measurement and a long-range order does not exist (this state is generally called "amorphous") in the oxide but the oxide has a rigid structure such as a spinel structure, an oxygen coordination polyhedron (e.g., $ZnO_4$ tetrahedra or $InO_6$ octahedra) and its concatenation type (e.g., edge sharing chain $InO_6$ octahedra called "rutile chain") are maintained. Thus, the substitutional doping may be effectively performed. With this structure, since density of states originated from tail states unique to amorphous states is small, sub-gap absorption is small, and an optical degradation characteristic is superior to that of a material having a highly amorphous characteristic. If the active layer is in a crystal state, doping is certainly effective, and a grain boundary effect is small in the conduction band composed of 4 s or 5 s band of heavy-metal ions. Note that if the doping amount is excessive and the dopant is segregated in the grain boundary, it is preferable to lower the dopant concentration. Further, the spinel structure is in the cubic family and has isotropy in the bottom of the conduction band. Accordingly, even if the spinel compound is a polycrystalline state, a large-size active matrix panel may be produced with minimum characteristic variations. That is, there is no inherent difference in a compound of the spinel composition between the amorphous state and the polycrystalline state. Further, post annealing may be carried out at a temperature range of 200 to 300° C. in order to improve adhesiveness and electric contact in an interface between the source and drain electrodes and the active layer. Moreover, annealing may be carried out at higher temperatures to increase crystallinity.

The second candidate example used as a material for the active layer 22 is a spinel compound represented by $AB_2O_4$ where A is one or more divalent cations including $Mg^{2+}$, $Zn^{2+}$, and $Cd^{2+}$, and B is one or more trivalent cations including $Al^{3+}$, $Ga^{3+}$, and $In^{3+}$. In the second candidate spinel compound, n-type doping may be carried out by introducing one or more types of cations including $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$ into one or more trivalent cations represented by B. Composition examples of the spinel compound in the parent phase may be the same as those in the first candidate example. Tetravalent cations including $Ge^{4+}$, $Sn^{4+}$, $Ti^{4+}$, $Zr^{4+}$, and $Hf^{4+}$, pentavalent cations including $V^{5+}$, $Nb^{5+}$, $Ta^{5+}$, and $Sb^{5+}$, and hexavalent cations including $Mo^{6+}$ and $W^{6+}$ may be used, as the n-type doping to be carried out on the trivalent cations including $Al^{3+}$, $Ga^{3+}$, and $In^{3+}$. These dopants may be used in combination of two or more for carrying out the n-type doping. The dopant may be selected based on an ion radius, a coordination number, and orbital energy. Doping concentration, post annealing, and the like may be the same as those in the first candidate example. For example, when a Sn-doped $MgIn_2O_4$ film is formed by sputtering, a target doped at approximately 1% Sn may be prepared. The target is conductive so that the target may be DC sputtered. Sn substituting for In site forms a donor. Accordingly, oxygen vacancy may be reduced by increasing oxygen concentration of a sputtering gas at a level higher than the oxygen concentration level in forming non-doped $MgIn_2O_4$.

The third candidate example used as a material for the active layer 22 is a spinel compound represented by $A_2DO_4$ where A is one or more divalent cations including $Mg^{2+}$, $Zn^{2+}$, and $Cd^{2+}$, and D is one or more tetravalent cations including $Sn^{4+}$, and $Ti^{4+}$. In the third candidate spinel compound, n-type doping may be carried out by introducing one or more types of cations including $Al^{3+}$, $Ga^{3+}$, $In^{3+}$, $Ge^{4+}$, $Sn^{4+}$, $Ti^{4+}$, $Zr^{4+}$, $Hf^{4+}$ $V^{5+}$, $Nb^{5+}$, $Ta^{5+}$, $Sb^{5+}$, $Mo^{6+}$, and $W^{6+}$ into one or more divalent cations represented by A. Examples of the spinel compound in the parent phase include $Mg_2SnO_4$, $Zn_2TiO_4$, $Zn_2SnO_4$, and $Cd_2SnO_4$. These compounds may be in solid solution. In the spinel compound, the composition is indicated by integers; however, unexpected non-stoichiometry or small amounts of impurities may be acceptable insofar as they do not interfere with the doping. Specifically, oxygen vacancy is easily generated so that the number of oxygen in the composition is less than 4 in general. Trivalent cations including $Al^{3+}$, $Ga^{3+}$, and $In^{3+}$, tetravalent cations including $Ge^{4+}$, $Sn^{4+}$, $Ti^{4+}$, $Zr^{4+}$, and $Hf^{4+}$, pentavalent cations including $V^{5+}$, $Nb^{5+}$, $Ta^{5+}$, and $Sb^{5+}$, and hexavalent cations including $Mo^{6+}$ and $W^{6+}$ may be used, as the n-type doping to be carried out on the divalent cations including $Mg^{2+}$, $Zn^{2+}$, and $Cd^{2+}$. These dopants may be used in combination of two or more for carrying out the n-type doping. The dopant may be selected based on an ion radius, a coordination number, and orbital energy. Doping concentration, post annealing, and the like may be the same as those in the first candidate example. For example, when an Al doped $Zn_2SnO_4$ film is formed by sputtering, a target doped at approximately 1% Al may be prepared. The target is conductive so that the target may be DC sputtered. If the doping concentration is too high, the amorphous characteristic is increased due to a local structural change, which disables the substitutional doping. In this case, the compound has an increased affinity for oxygen of Al to improve the stability; however, Al will not generate a donor. Since the carriers are only generated from oxygen vacancy, the carrier concentration is sensitive to the oxygen concentration in the deposition.

The fourth candidate example used as a material for the active layer 22 is a spinel compound represented by $A_2DO_4$ where A is one or more divalent cations including $Mg^{2+}$, $Zn^{2+}$, and $Cd^{2+}$, and D is one or more teravalent cations including $Sn^{4+}$, and $Ti^{4+}$. n-type doping may be carried out by introducing one or more types of cations, including $V^{5+}$, $Nb^{5+}$, $Ta^{5+}$, $Sb^{5+}$, $Mo^{6+}$, and $W^{6+}$ into one or more tetravalent cations represented by D. Composition examples of the spinel compound in the parent phase may be the same as those in the third candidate example. Pentavalent cations including $V^{5+}$, $Nb^{5+}$, $Ta^{5+}$, and $Sb^{5+}$, and hexavalent cations including $Mo^{6+}$ and $W^{6+}$ may be used, as the n-type doping to be carried out on the teravalent cations including $Sn^{4+}$, and $Ti^{4+}$. These dopants may be used in combination of two or more for carrying out the n-type doping. The dopant may be selected based on an ion radius, a coordination number, and orbital energy. Doping concentration, post annealing, and the like may be the same as those in the first candidate example. For example, when a Nb-doped $Zn_2TiO_4$ film is formed by sputtering, a target doped at approximately 1% Nb may be prepared. The target is conductive so that the target may be DC sputtered. Nb substituting for a Ti site forms a donor. Accordingly, oxygen vacancy may be reduced by increasing oxygen concentration of a sputtering gas at a level higher than the oxygen concentration level in forming non-doped $Zn_2TiO_4$.

The fifth candidate example used as a material for the active layer 22 is a bixbite compound that includes at least one element selected from $In^{3+}$, $Sc^{3+}$, $Y^{3+}$, and $Ln^{3+}$ (Ln is a rare earth element). In the fifth candidate bixbite compound, n-type doping may be carried out by introducing one or more elements selected from $Al^{3+}$, $Ga^{3+}$, $In^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$. Examples of the bixbite compound in a parent phase include $In_2O_3$, $Y_2O_3$, and $La_2O_3$, or solid solutions of these compounds. Further, the bixbite compound may include an example of a solid solution such as $In_{1.4}Zn_{0.3}Zr_{0.3}O_3$ obtained by substituting part of a trivalent cation with divalent and tetravalent cations. Unexpected non-stoichiometry or small amounts of impurities may be acceptable insofar as they do not interfere with the doping. In the solid solution of the bixbite compound, n-type doping may be carried out by substituting one or more types of cations; that is, trivalent cations including $Al^{3+}$, $Ga^{3+}$, and $In^{3+}$, and tetravalent cations including $Sn^{4+}$, $Ti^{4+}$, $Zr^{4+}$, and $Hf^{4+}$, pentavalent cations including $V^{5+}$, $Nb^{5+}$, $Ta^{5+}$, and $Sb^{5+}$, and hexavalent cations including $Mo^{6+}$ and $W^{6+}$ for the divalent cation. In addition, n-type doping may be carried out by substituting substituting one or more types of cations; that is, tetravalent cations including $Sn^{4+}$, $Ti^{4+}$, $Zr^{4+}$, and $Hf^{4+}$, pentavalent cations including $V^{5+}$, $Nb^{5+}$, $Ta^{5+}$, and $Sb^{5+}$, and hexavalent cations including $Mo^{6+}$ and $W^{6+}$ for the trivalent cation. In the solid solution of the bixbite compound, n-type doping may be carried out by substituting one or more types of cations; that is, pentavalent cations including $V^{5+}$, $Nb^{5+}$, $Ta^{5+}$, and $Sb^{5+}$, and hexavalent cations including $Mo^{6+}$ and $W^{6+}$ for the tetravalent cation. The dopant may be selected based on an ion radius, a coordination number, and orbital energy. Doping concentration, post annealing, and the like may be the same as those in the first candidate example. That is, there is no inherent difference in a composition of the bixbite compound between the amorphous state and the polycrystalline state. For example, when a W doped $In_{1.6}Y_{0.4}O_3$ film is formed by sputtering, a target doped at approximately 0.5% W is prepared. The target is conductive so that the target may be DC sputtered.

Examples of the tetragonal compound include, but are not limited to, a trirutile compound, and an aluminium compound.

The sixth candidate example used as a material for the active layer 22 is the trirutile compound represented by $AE_2O_6$ where A is one or more divalent cations including $Mg^{2+}$, $Zn^{2+}$, and $Cd^{2+}$, and E is one or more pentavalent cations including $Sb^{5+}$, $Nb^{5+}$, and $Ta^{5+}$. In the sixth candidate trirutile compound, n-type doping may be carried out by introducing one or more elements selected from $Al^{3+}$, $Ga^{3+}$, $In^{3+}$, $Y^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$. Examples of the trirutile compound in a parent phase include $ZnSb_2O_6$, $MgSb_2O_6$, and $MgTa_2O_6$, or solid solutions of these compounds. Unexpected non-stoichiometry or small amounts of impurities may be acceptable insofar as they do not interfere with the doping. In the trirutile compound, n-type doping may be carried out by substituting one or more types of cations; that is, trivalent cations including $Al^{3+}$, $Ga^{3+}$, and $In^{3+}$, and tetravalent cations including $Sn^{4+}$, $Ti^{4+}$, $Zr^{4+}$, and $Hf^{4+}$, pentavalent cations including $V^{5+}$, $Nb^{5+}$, $Ta^{5+}$, and $Sb^{5+}$, and hexavalent cations including $Mo^{6+}$ and $W^{6+}$ for one or more divalent cations represented by A. In addition, n-type doping may be carried out by substituting one or more types of cations; that is, hexavalent cations including $Mo^{6+}$ and $W^{6+}$ for one or more pentavalent cations represented by E. The dopant may be selected based on an ion radius, a coordination number, and orbital energy. Further, post annealing may be effective in order to improve adhesiveness and electric contact in an interface between the source and drain electrodes and the active layer. Although higher temperature annealing increases crystallinity to increase carrier generation efficiency, the trirutile compound has high anisotropy in the c-axis direction, which may cause characteristic variations. Thus, the higher temperature annealing may be carried out based on the requirements specification of its application. For example, when a W-doped $ZnSb_2O_6$ film is formed by sputtering, a target doped at approximately 1% W is prepared. The target is conductive so that the target may be DC sputtered.

Examples of the orthorhombic compound include, but are not limited to, an olivine compound, and a calcium ferrite compound.

The seventh candidate example used as a material for the active layer 22 is an olivine compound represented by $A_2GO_4$ where A is one or more divalent cations including $Mg^{2+}$, $Zn^{2+}$, and $Cd^{2+}$, and G is one or more tetravalent cations including $Si^{4+}$, $Ge^{4+}$, and $Sn^{4+}$. In the seventh candidate olivine compound, n-type doping may be carried out by introducing one or more elements selected from $Al^{3+}$, $Ga^{3+}$, $In^{3+}$, $Y^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$. Examples of the olivine compound in a parent phase include $Cd_2GeO_4$, and $MgGeO_4$, or solid solutions of these compounds. Unexpected non-stoichiometry or small amounts of impurities may be acceptable insofar as they do not interfere with the doping. In the olivine compound, n-type doping may be carried out by substituting one or more types of cations; that is, trivalent cations including $Al^{3+}$, $Ga^{3+}$, and $In^{3+}$, and tetravalent cations including $Sn^{4+}$, $Ti^{4+}$, $Zr^{4+}$, and $Hf^{4+}$, pentavalent cations including $V^{5+}$, $Nb^{5+}$, $Ta^{5+}$, and $Sb^{5+}$, and hexavalent cations including $Mo^{6+}$ and $W^{6+}$ for one or more divalent cations represented by A. In addition, n-type doping may be carried out by substituting one or more types of cations; that is, pentavalent cations including $V^{5+}$, $Nb^{5+}$, $Ta^{5+}$, and $Sb^{5+}$, and hexavalent cations including $Mo^{6+}$ and $W^{6+}$ for one or more tetravalent cations represented by G. The dopant may be selected based on an ion radius, a coordination number, and orbital energy. Further, post annealing may be effective in order to improve adhesiveness and electric contact in an interface between the source and drain electrodes and the active layer. Although higher temperature annealing increases crystallinity to increase carrier generation efficiency, the olivine compound has anisotropy, which may cause characteristic variations. Thus, the higher temperature annealing may be carried out based on the requirements specification of its application. For example, when a Nb-doped $Cd_2GeO_4$ film is formed by sputtering, a target doped at approximately 1% Nb may be prepared. The target is conductive so that the target may be DC sputtered.

Examples of the hexagonal compound includes, but not limited to, a $PbSb_2O_6$ type compound, and the homologous compound.

The eighth candidate example used as a material for the active layer 22 is a $PbSb_2O_6$ type compound represented by $RE_2O_6$ where R is one or more divalent cations including $Ca^{2+}$, $Sr^{2+}$, $Ba^{2+}$, $Cd^{2+}$, and $Pb^{2+}$, and E is one or more pentavalent cations including $Sb^{5+}$, $Nb^{5+}$, and $Ta^{5+}$. In the eighth candidate $PbSb_2O_6$ type compound, n-type doping may be carried out by introducing one or more elements selected from $Al^{3+}$, $Ga^{3+}$, $In^{3+}$, $Y^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$. Examples of the $PbSb_2O_6$ type compound in a parent phase include $CdSb_2O_6$, and $PbSb_2O_6$, or solid solutions of these compounds. Unexpected non-stoichiometry or small amounts of impurities may be acceptable insofar as they do not interfere with the doping. In the $PbSb_2O_6$ type compound, n-type doping may be carried out by substituting one or more types of cations; that is, trivalent cations including $Al^{3+}$, $Ga^{3+}$, and $In^{3+}$, and tetravalent cations including $Sn^{4+}$, $Ti^{4+}$, $Zr^{4+}$, and $Hf^{4+}$, pentavalent cations including $V^{5+}$, $Nb^{5+}$, $Ta^{5+}$, and $Sb^{5+}$, and hexavalent cations including $Mo^{6+}$ and $W^{6+}$ for one or more divalent cations represented by R. In addition, n-type doping may be carried out by substituting one or more types of cations; that is, hexavalent cations including $Mo^{6+}$ and $W^{6+}$ for one or more pentavalent cations represented by E. The dopant may be selected based on an ion radius, a coordination number, and orbital energy. Further, post annealing may be effective in order to improve adhesiveness and electric contact in an interface between the source and drain electrodes and the active layer. Although higher temperature annealing increases crystallinity to increase carrier generation efficiency, the $PbSb_2O_6$ type compound has anisotropy, which may cause characteristic variations. Thus, the higher temperature annealing may be carried out based on the requirements specification of its application. For example, when a Mo-doped $CdSb_2O_6$ film is formed by sputtering, a target doped at approximately 1% Mo is prepared. The target is conductive so that the target may be DC sputtered.

The ninth candidate example used as a material for the active layer 22 is a homologous compound represented by $In_2O_3(ZnO)_m$ (m=integer of two to 6). In the ninth candidate homologous compound, n-type doping may be carried out by introducing one or more one or more types of cations including $V^{5+}$, $Nb^{5+}$, $Ta^{5+}$, $Sb^{5+}$, $Mo^{6+}$, and $W^{6+}$. The dopant may be selected based on an ion radius, a coordination number, and orbital energy. Doping concentration may be the same as those in the first candidate example. For example, when a Sb doped $In_2Zn_2O_5$ film is formed by sputtering, a target doped at approximately 1% Sb is prepared. The target is conductive so that the target may be DC sputtered. If the doping concentration is too high, the amorphous characteristic is increased due to a local structural change, which disables carrier doping. In this case, the compound has an increased amorphous property; however, the Sb will not generate a donor. Since the carriers are only generated from oxygen vacancy, the carrier concentration is sensitive to the oxygen concentration in the deposition. Further, post annealing may be effective in order to improve adhesiveness and electric contact in an interface between the source and drain electrodes and the active layer. Although higher temperature annealing increases crystallinity to increase carrier generation efficiency, the homologous compound has high anisotropy in the c-axis direction, which may cause characteristic variations. Thus, the higher temperature annealing may be carried out based on the requirements specification of its application.

Next, the source electrode 23 and the drain electrode 24 are formed on parts of the active layer 22 and the gate insulator layer 25. The source electrode 23 and the drain electrode 24 may be made of various materials, may be formed in various processes and may be formed by various patterning methods. Examples of the material for the source and drain electrodes 23 and 24 include metals such as Mo, Al, and Ag or alloys of such metals, transparent conducting oxides such as ITO and ATO, and organic conductors such as polyethylenedioxythiophene (PEDOT) and polyaniline (PANI). Preferable materials may include those having a relatively low work function such as Mo, TiN, and ITO in view of efficiently injecting carriers in the n-type oxide semiconductor. The source electrode 23 and the drain electrode 24 may be formed in a deposition process by sputtering or dip coating and then patterning the deposited film by photolithography, or directly depositing on a substrate with a predetermined shape by a printing process such as ink-jet printing, nanoimprint lithography, or gravure printing.

The field effect transistor (i.e., first and second field effect transistors) is thus fabricated according to the above process.

Figure 8:
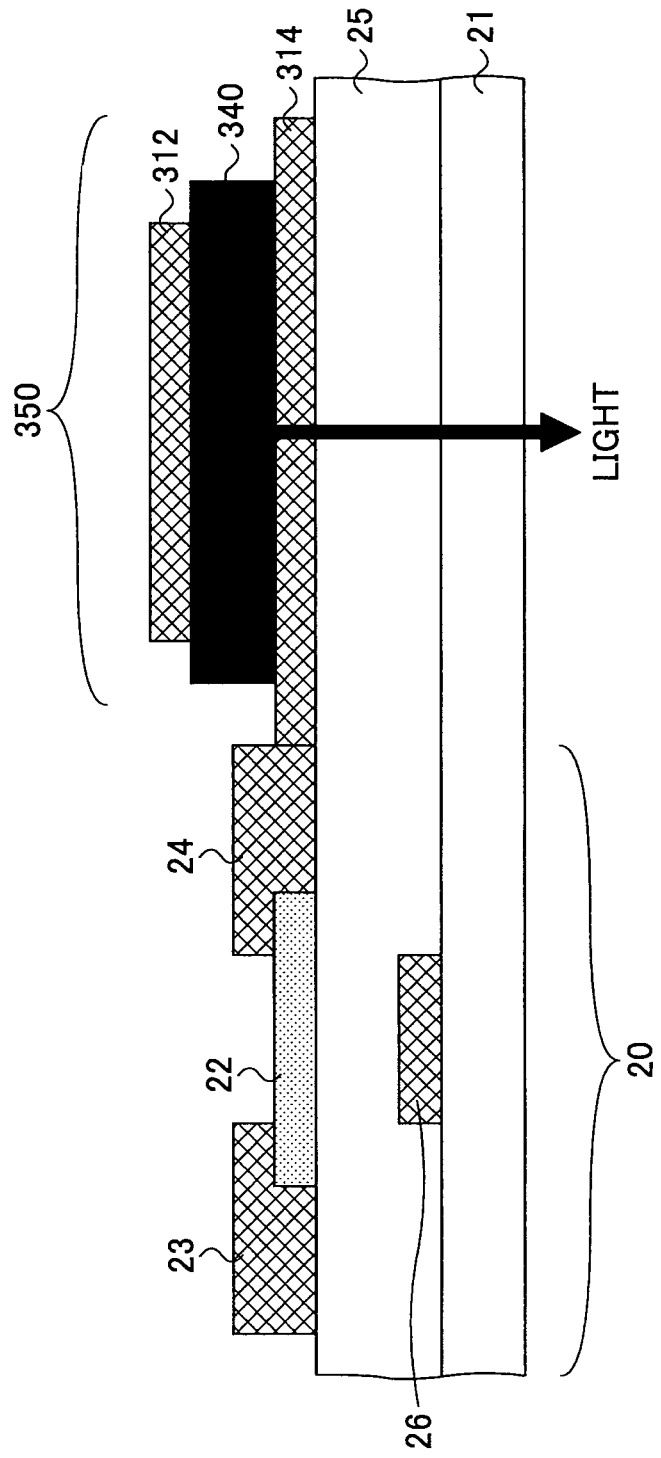
FIG. 8 is a diagram illustrating arrangement of the organic EL element and the field effect transistor.

FIG. 8 illustrates a positional relationship between the organic EL element 350 and the field effect transistor 20 in the display element 302. As illustrated in FIG. 8, the organic EL element 350 is arranged adjacent to the field effect transistor 20. Note that the field effect transistor 10 and the capacitor 30 are also formed in the same substrate.

Although not illustrated in FIG. 8, it is preferable that a protection film may be provided at an upper side of the active layer 22. Materials for the protection film may include $SiO_2$, $SiN_x$, $Al_2O_3$, and fluorine polymer. If CVD and sputtering are used for depositing the protection film, the active layer 22 is exposed to plasma or a high vacuum condition. Thus, the oxygen is easily removed from the active layer formed of the oxide semiconductor to degrade the TFT characteristics. However, the oxide semiconductor used in the embodiments has high stability in the post process to suppress the characteristic degradation.

The display element 302 may be fabricated in the same fabrication process as the related art fabrication process using the same device as the related art device.

Figure 9:
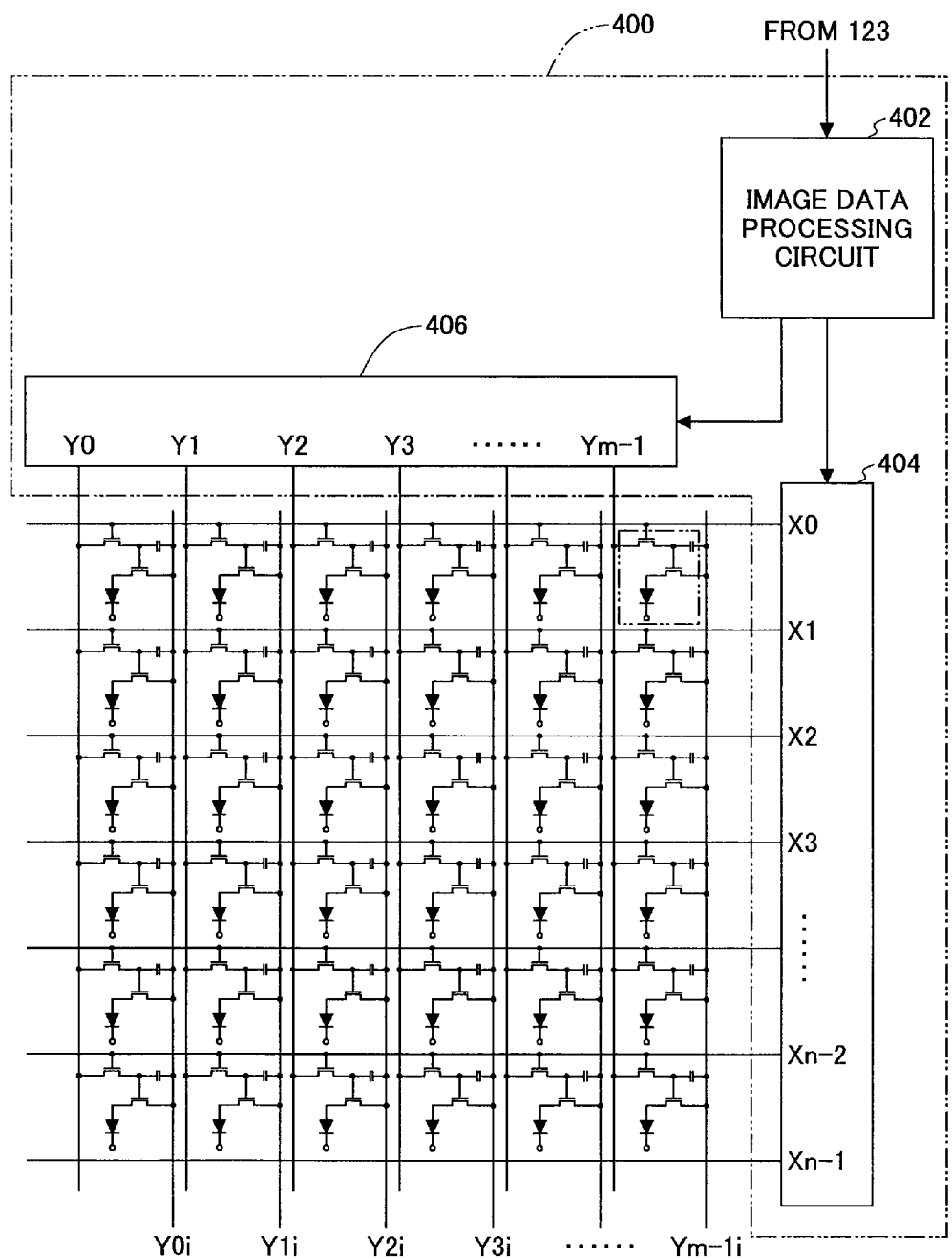
FIG. 9 is a diagram illustrating a display control device.

As illustrated as an example in FIG. 9, a display control device 400 includes an image data processing circuit 402, a scanning line drive circuit 404, and a data line drive circuit 406.

The image data processing circuit 402 determines the luminance image of the display elements 302 of the display 310 based on an output signal from the output circuit 123.

The scanning line drive circuit 404 separately applies a voltage to each of the n scanning lines based on instructions from the image data processing circuit 402.

The data line drive circuit 406 separately applies a voltage to each of the m data lines based on instructions from the image data processing circuit 402.

As is clear from the above illustration, in the television apparatus 100 according to the embodiments, the image decoder 121, the image-OSD synthetic circuit 122, and the OSD plotting circuit 125 form an image data generating device.

As described above, the field effect transistor (including first and second field effect transistors 10 and 20) according to the embodiments include the gate electrode 26 to which a gate voltage is applied; the source electrode 23 and the drain electrode 24 for acquiring (passing) a current in response to the gate voltage; the active layer 22 provided adjacent to the source electrode 23 and the drain electrode 24 and formed of an n-type doped oxide semiconductor; and the gate insulator layer 25 provided between the gate electrode 26 and the active layer 22.

Further, the display element 302 according to the embodiments includes the first field effect transistor 10 and the second field effect transistor 20. With this configuration, the display element 302 may be driven at a high speed and inter-element characteristic variations may be reduced.

In addition, the image display device 124 according to the embodiments includes the display element 302. With this configuration, images may be displayed on a large-size screen with high image quality.

Further, the television apparatus 100 (i.e., the system) according to the embodiments includes the image display device 124. With this configuration, image information may be displayed with high image definition.

Note that in the above embodiments, the organic EL thin film layer 340 is formed of the electron transport layer 342, the emitting layer 344 and the hole transport layer 346; however, the organic EL thin film layer 340 is not limited to such a configuration. For example, in the organic EL thin film layer 340, the electron transport layer 342 and the emitting layer 344 form a layer. Further, an electron injection layer may be provided between the electron transport layer 342 and the cathode 312. Moreover, a hole injection layer may be provided between the hole transport layer 346 and the anode 314.

In the above embodiments, a so-called "bottom emission" example where emission light is emitted from the substrate side is described; however, the emission light may not be emitted from the substrate side. For example, the anode 314 may be formed of a high-reflectance electrode such as silver (Ag)-neodymium (Nd) alloy, and the cathode 312 may be formed of a semi-transparent electrode such as magnesium (Mg)-silver (Ag) alloy or a transparent electrode such as ITO so as to emit emission light from a side opposite to the substrate.

Figure 10:
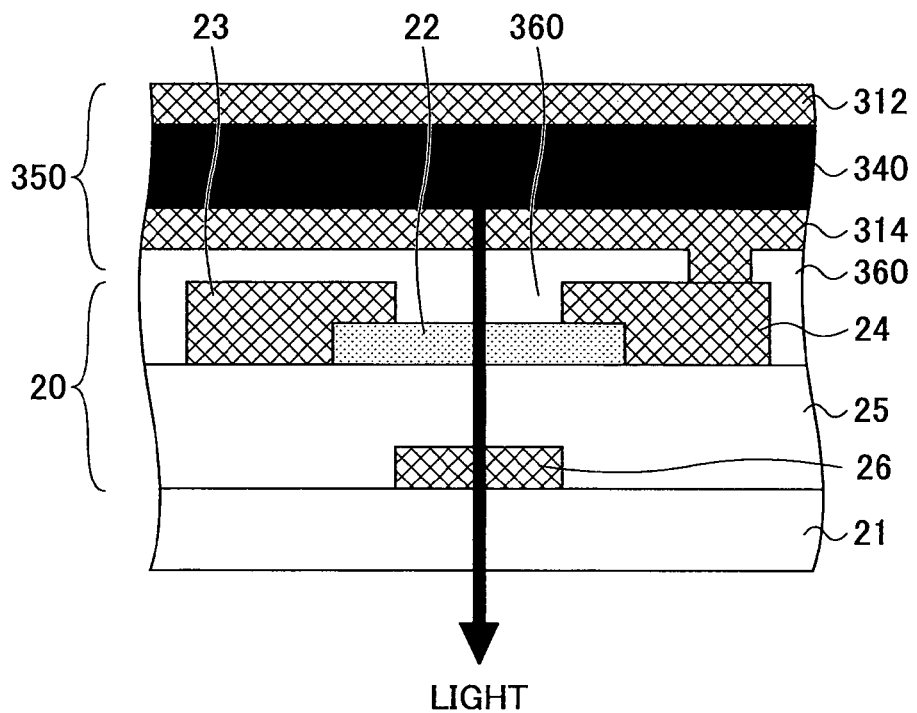
FIG. 10 is a diagram illustrating a modification of the arrangement of the organic EL element and the field effect transistor.

Further, in the above embodiments, the display element 302 where the organic EL element 350 is arranged adjacent to the field effect transistor 20 is described; however, the configuration of the display element 20 is not limited to such a description. For example, as illustrated in FIG. 10, the organic EL element 350 may be arranged above the field effect transistor 20. In such a case, the gate electrode 26 needs to be transparent, and thus may be formed of a transparent conducting oxide such as ZnO containing ITO, $In_2O_3$, $SnO_2$, and Ga, and Al added ZnO, and Sb added $SnO_2$. The oxide semiconductor in the above embodiments has a wide band gap, transparency to visible light, and small density of states originated from tail states unique to the amorphous semiconductor is small. Accordingly, the oxide semiconductor in the above embodiments may be effective for a Si semiconductor or an organic semiconductor, and an oxide semiconductor having highly amorphous characteristics in this configuration. Note that a reference numeral 360 in FIG. 10 indicates an interlayer insulator film (i.e., planarization film). The interlayer insulator film 360 may be formed of polyimide or acrylic resin. Since the oxide semiconductor according to the above embodiments has high process stability, the characteristic degradation in this process may also be suppressed.

Figure 11:
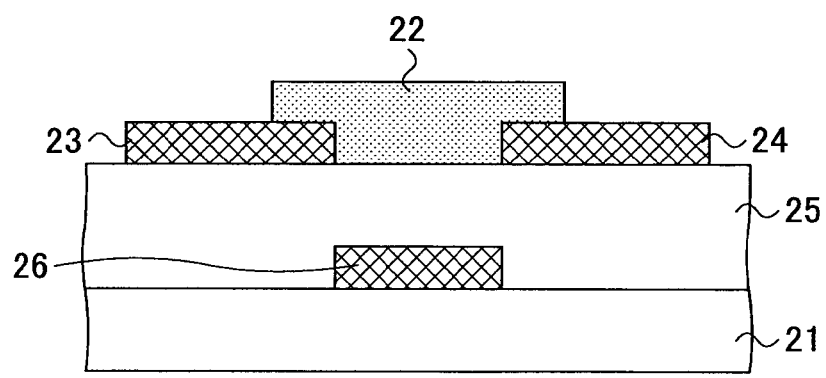
FIG. 11 is a diagram illustrating a "bottom-contact/bottom-gate type" field effect transistor.
Figure 12:
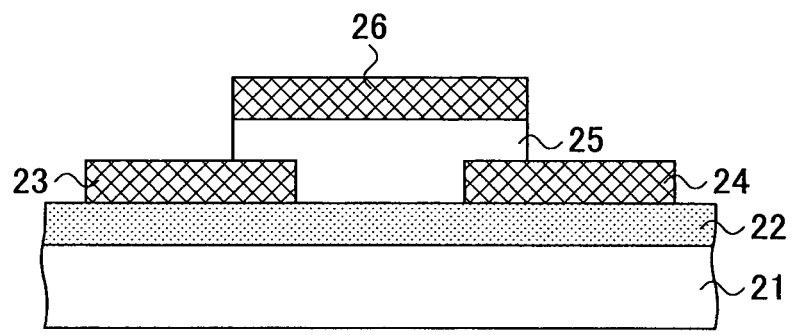
FIG. 12 is a diagram illustrating a "top-contact/top-gate type" field effect transistor.
Figure 13:
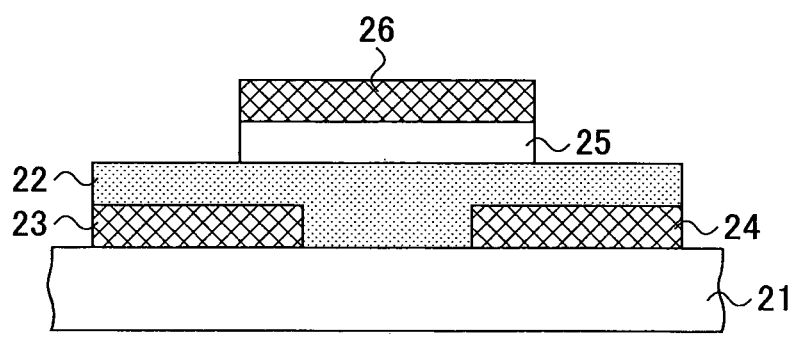
FIG. 13 is a diagram illustrating a "bottom-contact/top-gate type" field effect transistor.

Further, in the above embodiments, the so-called "top-contact/bottom-gate type" field effect transistor is described; however, the field effect transistor is not limited to the "top-contact/bottom-gate type". For example, the field effect transistor in the above embodiments may be the "bottom-contact/bottom-gate type" as illustrated in FIG. 11. Further, the field effect transistor in the above embodiments may be the "top-contact/top-gate type" as illustrated in FIG. 12. In addition, the field effect transistor in the above embodiments may be the "bottom-contact/top-gate type" as illustrated in FIG. 13.

In the above embodiments, the organic EL element serving as the optical control element is described; however, the optical control element is not limited to the organic EL element. For example, the optical control element may be an electrochromic element. In such a case, the display 310 may be an electrochromic display.

Figure 14:
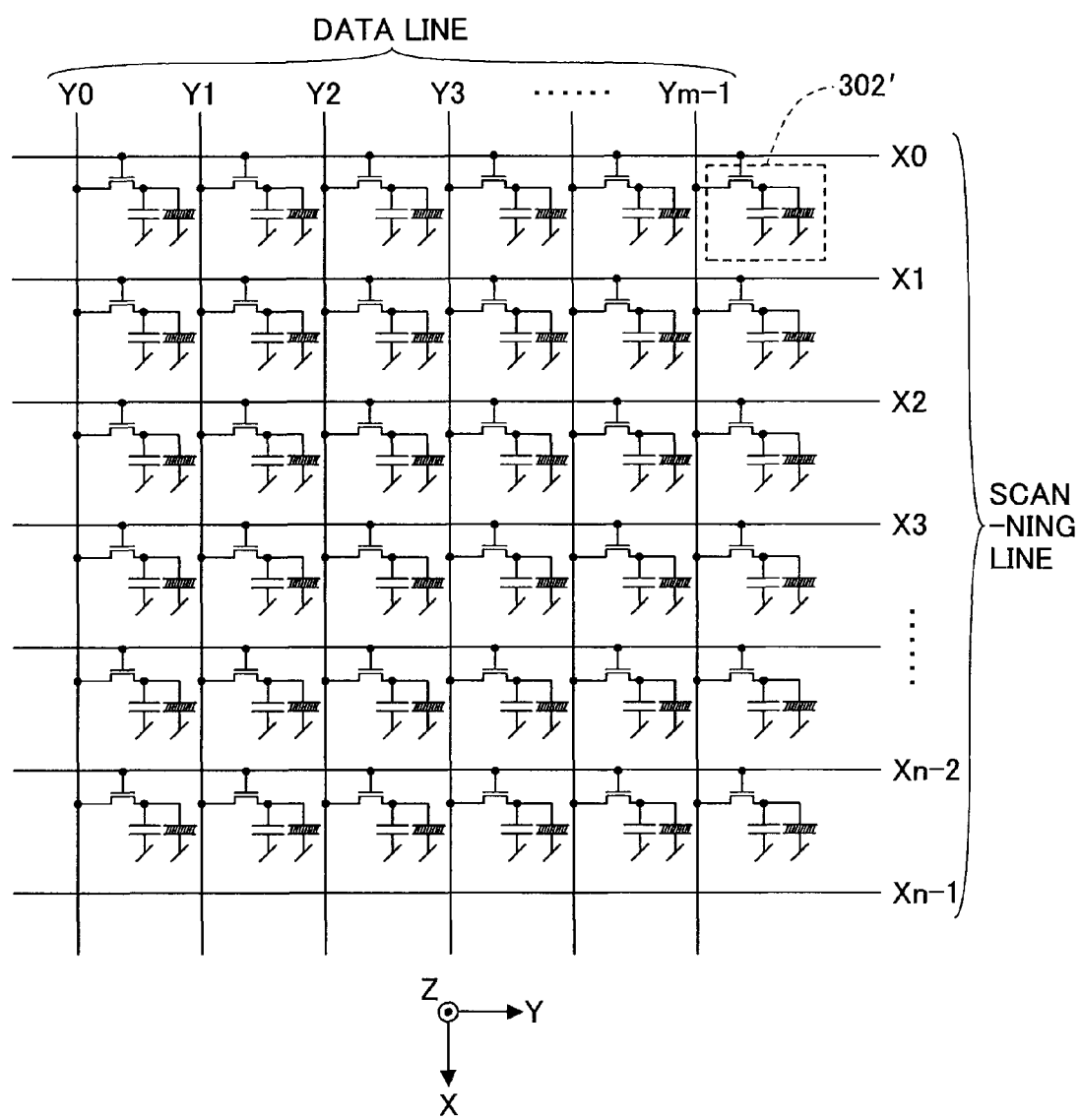
FIG. 14 is a diagram illustrating a liquid crystal display.

In addition, the optical control element may be a liquid crystal element. In such a case, the display 310 may be a liquid crystal display. As illustrated as an example in FIG. 14, the current supply lines for display elements 302 are not needed in the liquid crystal display.

Figure 15:
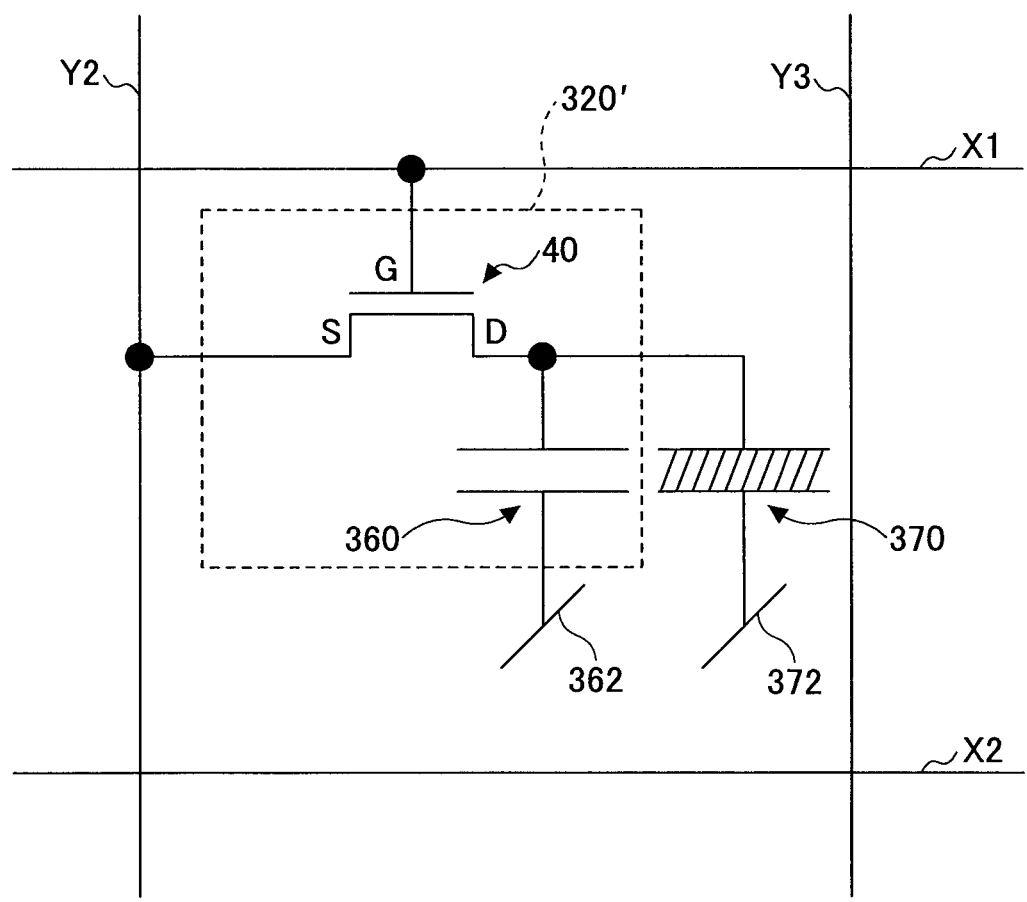
FIG. 15 is a diagram illustrating display elements of the liquid crystal display in FIG. 14.

As illustrated as an example in FIG. 15, a drive circuit 320' includes one field effect transistor 40 having a configuration similar to those of the aforementioned first and second field effect transistors 10 and 20, and a capacitor 360. In the field effect transistor 40, a gate electrode G is connected to a predetermined scanning line and a source electrode S is connected to a predetermined line. Further, a drain electrode D is connected to a pixel electrode of a liquid crystal element 370, and the capacitor 360. Note that reference numerals 362 and 372 in FIG. 15 indicate counter electrodes (common electrodes) of the capacitor 360 and the liquid crystal element 370, respectively.

In addition, the optical control element may be an electrophoretic element.

Moreover, the optical control element may be an inorganic EL element.

Further, in the above embodiments, a color compatible display is described as the display 310; however, the display is not limited to the color compatible display.

Further, in the above embodiments, the system is described as the television apparatus 100; however, the system is not limited to such a television apparatus. That is, the system is configured to simply include the image display device 124 as a device for displaying images and information. For example, the system may be a computer system where a computer including a personal computer and the image display device 124 are connected.

Further, the image display device 124 may be used as a display unit in a mobile information apparatus such as a mobile phone, a mobile music player, a mobile video player, an electronic book, and a PDA (Personal Digital Assistant); and an imaging apparatus such as a digital still camera or a camcorder. In addition, the image display device 124 may be used as a display unit in a mobile system such as a vehicle, an aircraft, an electric train, and a ship. In addition, the image display device 124 may be used as a display unit in a measurement device, an analyzer device, a medical device, and an advertising medium.

Note that the field effect transistor according to the above embodiments may be used as an element such as an IC card or ID tag other than the display element.

According to one embodiment, there is provided a field effect transistor including a gate electrode to which a gate voltage is applied; a source electrode and a drain electrode for acquiring a current in response to the gate voltage; an active layer provided adjacent to the source electrode and the drain electrode, the active layer being formed of an n-type oxide semiconductor; and a gate insulator layer provided between the gate electrode and the active layer. In the field effect transistor, the n-type oxide semiconductor is formed of an n-type doped compound having a chemical composition of a crystal phase obtained by introducing at least one of a trivalent cation, a tetravalent cation, a pentavalent cation and a hexavalent cation.

In the field effect transistor described above, the n-type oxide semiconductor is formed of an n-type doped cubic compound obtained by introducing at least one of a trivalent cation, a tetravalent cation, a pentavalent cation and a hexavalent cation.

Further, in the field effect transistor described above, the n-type oxide semiconductor is formed of a spinel compound represented by $AB_2O_4$ where A is one or more divalent cations including $Mg^{2+}$, $Zn^{2+}$, and $Cd^{2+}$, and B is one or more trivalent cations including $Al^{3+}$, $Ga^{3+}$, and $In^{3+}$; and the n-type doped compound formed of the spinel compound is obtained by introducing one or more types of cations including $Al^{3+}$, $Ga^{3+}$, $In^{3+}$, $Ge^{4+}$, $Sn^{4+}$, $Ti^{4+}$, $Zr^{4+}$, $Hf4+$, $V^{5+}$, $Nb^{5+}$, $Ta^{5+}$, $Nb^{5+}$, $Mo^{6+}$, and $W^{6+}$ into the one or more divalent cations represented by the A.

Further, in the field effect transistor described above, the n-type oxide semiconductor is formed of a spinel compound represented by $AB_2O_4$ where A is one or more divalent cations including $Mg^{2+}$, $Zn^{2+}$, and $Cd^{2+}$, and B is one or more trivalent cations including $Al^{3+}$, $Ga^{3+}$, and $In^{3+}$; and the n-type doped compound formed of the spinel compound is obtained by introducing one or more types of cations including $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$ into the one or more trivalent cations represented by B.

Further, in the field effect transistor described above, the n-type oxide semiconductor is formed of a spinel compound represented by $A_2DO_4$ where A is one or more divalent cations including $Mg^{2+}$, $Zn^{2+}$, and $Cd^{2+}$, and D is one or more tetravalent cations including $Ti^{4+}$, and $Sn^{4+}$; and the n-type doped compound formed of the spinel compound is obtained by introducing one or more types of cations including $Al^{3+}$, $Ga^{3+}$, $In^{3+}$, $Ge^{4+}$, $Sn^{4+}$, $Ti^{4+}$, $Zr^{4+}$, $Hf^{4+}$, $V^{5+}$, $Nb^{5+}$, $Sb^{5+}$, $Ta^{5+}$, $Mo^{6+}$, and $W^{6+}$ into the one or more divalent cations represented by A.

Further, in the field effect transistor described above, the n-type oxide semiconductor is formed of a spinel compound represented by $A_2DO_4$ where A is one or more divalent cations including $Mg^{2+}$, $Zn^{2+}$, and $Cd^{2+}$, and D is one or more tetravalent cations including $Ti^{4+}$, and $Sn^{4+}$; and the n-type doped compound formed of the spinel compound is obtained by introducing one or more types of cations including $V^{5+}$, $Nb^{5+}$, $Ta^{5+}$, $Sb^{5+}$, $Mo^{6+}$, and $W^{6+}$ into the one or more tetravalent cations represented by the D.

Further, in the field effect transistor described above, the n-type oxide semiconductor is formed of a bixbite compound having one or more of trivalent cations selected from $In^{3+}$, $Sc^{3+}$, $Y^{3+}$, and $Ln^{3+}$ where the Ln is a rare earth element; and the n-type doped compound formed of the bixbite compound is obtained by introducing one or more types of cations including $Al^{3+}$, $Ga^{3+}$, $In^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$.

Further, in the field effect transistor described above, the n-type oxide semiconductor is formed of an n-type doped tetragonal compound obtained by introducing at least one of a trivalent cation, a tetravalent cation, a pentavalent cation and a hexavalent cation.

Further, in the field effect transistor described above, the n-type oxide semiconductor is formed of a trirutile compound represented by $AE_2O_6$ where A is one or more divalent cations including $Mg^{2+}$, $Zn^{2+}$, and $Cd^{2+}$, and E is one or more pentavalent cations including $Sb^{5+}$, $Nb^{5+}$, and $Ta^{5+}$; and the n-type doped compound formed of the trirutile compound is obtained by introducing one or more types of cations including $Al^{3+}$, $Ga^{3+}$, $In^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$.

Further, in the field effect transistor described above, the n-type oxide semiconductor is formed of an n-type doped orthorhombic compound obtained by introducing at least one of a trivalent cation, a tetravalent cation, a pentavalent cation and a hexavalent cation.

Further, in the field effect transistor described above, the n-type oxide semiconductor is formed of an olivine compound represented by $A_2GO_4$ where A is one or more divalent cations including $Mg^{2+}$, $Zn^{2+}$, and $Cd^{2+}$, and G is one or more tetravalent cations including $Si^{4+}$, $Ge^{4+}$, and $Sn^{4+}$; and the n-type doped compound formed of the olivine compound is obtained by introducing one or more types of cations including $Al^{3+}$, $Ga^{3+}$, $In^{3+}$, $Y^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$.

Further, in the field effect transistor described above, the n-type oxide semiconductor is formed of an n-type doped hexagonal compound obtained by introducing at least one of a trivalent cation, a tetravalent cation, a pentavalent cation and a hexavalent cation.

Further, in the field effect transistor described above, the n-type oxide semiconductor is formed of a $PbSb_2O_6$ type compound represented by $RE_2O_6$ where R is one or more divalent cations including $Ca^{2+}$, $Sr^{2+}$, $Ba^{2+}$, $Cd^{2+}$, and $Pb^{2+}$, and E is one or more pentavalent cations including $Sb^{5+}$, $Nb^{5+}$, and $Ta^{5+}$; and the n-type doped compound formed of the $PbSb_2O_6$ type compound is obtained by introducing one or more types of cations including $Al^{3+}$, $Ga^{3+}$, $In^{3+}$, $Y^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$.

Further, in the field effect transistor described above, the n-type oxide semiconductor is formed of a homologous compound represented by $In_2O_3(ZnO)_m$ where the m is an integer of two to six; and the n-type doped compound formed of the homologous compound is obtained by introducing one or more types of cations including $V^{5+}$, $Nb^{5+}$, $Ta^{5+}$, $Sb^{5+}$, $Mo^{6+}$, and $W^{6+}$.

Note that a crystal compound indicates a compound having a chemical composition of a crystal phase that is thermodynamically stable in a phase diagram. The active layer of the compound having the chemical composition may be a thermodynamically metastable state.

Further, a cubic compound indicates a compound having a chemical composition of a crystal in the cubic family that is thermodynamically stable in a phase diagram. The active layer of the compound having the chemical composition may be a thermodynamically metastable state.

Similarly, a tetragonal compound, an orthorhombic compound and a hexagonal compound indicate compounds respectively having a chemical composition of a crystal in the tetragonal family, the orthorhombic family and the hexagonal family that are thermodynamically stable in a phase diagram. The active layer of the compound having such chemical composition may be a thermodynamically metastable state.

A spinel compound indicates a compound having a chemical composition of a spinel crystal that is thermodynamically stable in a phase diagram. The active layer of the compound having the chemical composition may be a thermodynamically metastable state.

Similarly, a bixbite compound, a pyrochlore compound, a fluorite compound, a trirutile compound, an olivine compound, a $PbSb_2O_6$ type compound and a homologous compound, indicate compounds respectively having a chemical composition of a bixbite crystal, a pyrochlore crystal, a fluorite crystal, a trirutile crystal, an olivine crystal, a $PbSb_2O_6$ type crystal and a homologous crystal that are thermodynamically stable in a phase diagram. The active layer of the compound having such chemical composition may be a thermodynamically metastable state.

In order to implement the n-type substitutional doping, it may be necessary to introduce an n-type substituting cation having a larger valence into a substituted cation site while maintaining a local structure. In view of this aspect, the spinel compound or the bixbite compound may be particularly preferable. The pyrochlore compound, the fluorite compound and the like may also be preferable. If a compound has a highly amorphous characteristic, local structural change ma occur by doping. Accordingly, the dopant may not generate carriers for forming a stable local structure. If a compound has a rigid structure such as a spinel compound or a bixbite compound but appears amorphous (no periodic structure in a long range) by X-ray diffraction, the compound maintains a short distance and middle distance structure of the crystal phase. Thus, carriers may be generated by introducing a dopant having an appropriate energy level into a substituted cation site. In view of carrier generation, the compound may be crystallized. That is, unlike the hexagonal crystal such as ZnO or IGZO, the cubic crystal has no anisotropy in mobility so that there is no problem in applying the cubic compound in a large-area.

A spinel compound is represented by $AB_2O_4$ and has a rigid structure where oxygen has a face-centered cubic lattice. Preferable examples of the spinel compound includes compounds represented by $AB_2O_4$ where A is one or more divalent cations including $Mg^{2+}$, $Zn^{2+}$, and $Cd^{2+}$, and B is one or more trivalent cations including $Al^{3+}$, $Ga^{3+}$, and $In^{3+}$. That is, $MgGa_2O_4$, $MgIn_2O_4$, $ZnAl_2O_4$, $ZnGa_2O_4$, and $CdGa_2O_4$ may be given. These compounds may be in solid solution. In these spinel compounds, n-type doping may be carried out by introducing one or more types of cations including $Al^{3+}$, $Ga^{3+}$, $In^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$ into one or more divalent cations represented by A. Likewise, electron carriers may be generated by introducing one or more cations including $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$ for one or more trivalent cations represented by B.

The spinel compound further includes compounds formed of divalent and tetravalent cations. Preferable examples of such a spinel compound composed of divalent and tetravalent cations include compounds represented by $A_2DO_4$ where A is one or more divalent cations including $Mg^{2+}$, $Zn^{2+}$, and $Cd^{2+}$; and D is one or more tetravalent cations including $Sn^{4+}$, and $Ti^{4+}$. That is, $Mg_2TiO_4$, $Mg_2SnO_4$, $Zn_2TiO_4$, $Zn_2SnO_4$, and $Cd_2SnO_4$ may be given. These compounds may be in solid solution. In these spinel compounds, n-type doping may be carried out by introducing one or more cations including $Al^{3+}$, $Ga^{3+}$, $In^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$ into one or more divalent cations represented by A. Likewise, electron carriers may be generated by introducing one or more cations including, $V^{5+}$, $Nb^{5+}$, $Ta^{5+}$, $Sb^{5+}$, $Mo^{6+}$, and $W^{6+}$ for the tetravalent cation represented by D.

Further, another example of the cubic compound capable of carrying out the n-type doping includes a bixbite compound having one or more of trivalent cations selected from $In^{3+}$, $Sc^{3+}$, $Y^{3+}$, and $Ln^{3+}$ (Ln is a rare earth element). Examples of the bixbite compound having one or more of trivalent cations may be $In_2O_3$, $Y_2O_3$, and $La_2O_3$, or solid solutions of these compounds. Further, the bixbite compound may include an example of a solid solution such as $In_{1.4}Zn_{0.3}Zr_{0.3}O_3$ obtained by substituting part of a trivalent cation with divalent and tetravalent cations. The bixbite compound has a body-centered cubic structure, and may be capable of generating electron carriers by introducing one or more cations including $Al^{3+}$, $Ga^{3+}$, $In^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$ into the substituted cation sites to carry out n-type doping.

An example of the tetragonal compound capable of carrying out the n-type doping includes a trirutile compound represented by $AE_2O_6$ where A is one or more divalent cations including $Mg^{2+}$, $Zn^{2+}$, and $Cd^{2+}$, and E is one or more pentavalent cations including $Sb^{5+}$, $Nb^{5+}$, and $Ta^{5+}$. The trirutile compound may be capable of generating electron carriers by introducing one or more cations including $Al^{3+}$, $Ga^{3+}$, $In^{3+}$, $Y^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$ and $W^{6+}$ into the substituted cation sites to carry out n-type doping.

An example of the orthorhombic compound capable of carrying out the n-type doping includes an olivine compound represented by $A_2GO_4$ where A is one or more divalent cations including $Mg^{2+}$, $Zn^{2+}$, and $Cd^{2+}$, and G is one or more tetravalent cations including $Si^{4+}$, $Ge^{4+}$, and $Sn^{4+}$. The olivine compound may be capable of generating electron carriers by introducing one or more cations including $Al^{3+}$, $Ga^{3+}$, $In^{3+}$, $Y^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$ into the substituted cation sites to carry out n-type doping.

An example of the hexagonal compound capable of carrying out the n-type doping includes a $PbSb_2O_6$ type compound represented by $RE_2O_6$ where R is one or more divalent cations including $Ca^{2+}$, $Sr^{2+}$, $Ba^{2+}$, $Cd^{2+}$, and $Pb^{2+}$, and E is one or more pentavalent cations including $Sb^{5+}$, and $Ta^{5+}$. The $PbSb_2O_6$ type compound may be capable of generating electron carriers by introducing one or more cations including $Al^{3+}$, $Ga^{3+}$, $In^{3+}$, $Y^{3+}$, $Ge^{4+}$, $Sn^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$ into the substituted cation sites to carry out n-type doping.

An example of the hexagonal compound capable of carrying out the n-type doping includes a homologous compound represented by $In_2O_3(ZnO)_m$ =integer of two to six). The homologous compound has a series of hexagonal layer structure of which has been systematically studied by Kimizuka et al. The homologous compound has a flexible system capable of forming numerous variations with various m values. In the homologous compound, even when $Zn^{2+}$ site is substituted with trivalent cation M such as $Al^{3+}$ or $Ga^{3+}$, the $Zn^{2+}$ site is not substituted with trivalent cation M but an isomorphous compound represented by $InMO_3(ZnO)_{m'}$ is formed. As a result, carriers are not generated. IGZO is an example of the isomorphous compound. If the compound is doped with tetravalent $Sn^{4+}$, an effective n-type dopant may not be obtained while increasing the amorphous characteristic. However, the inventors of the present application have found that the electron carriers may be generated by carefully introducing one or more cations including $V^{5+}$, $Nb^{5+}$, $Ta^{5+}$, $Sb^{5+}$, $Mo^{6+}$, and $W^{6+}$.

According to an embodiment, there is provided a display element that includes an optical control element configured to control an optical output based on a driving signal; the field effect transistor described above; and a drive circuit configured to drive the optical control element.

With this configuration, since the display element includes the field effect transistor described above, inter-element, characteristic variations may be reduced.

According to another embodiment, there is provided an image display device for displaying images based on image data that includes plural of the above display elements arranged in a matrix; plural of wires configured to individually apply gate voltages to the respective field effect transistors in the display elements arranged in the matrix; and a display control device configured to separately control the gate voltages of the field effect transistors via the wires based on the image data.

With this configuration, since the image display device includes the above display element, images may be displayed on a large-size screen with high image quality.

According to another embodiment, there is provided a system that includes the above image display device; and an image data generating device configured to generate image data based on image information to be displayed and output the generated image data to the image display device.

With this configuration, since the system includes the above image display device, the image information may be displayed with high image definition.

As described above, the embodiments may provide a field effect transistor capable of generating electron carriers by introducing n-type substitutional doping in an active layer formed of an n-type oxide semiconductor and sufficiently introducing oxygen in a forming process so as to make rigorous oxygen concentration control unnecessary, enhance lattice stability by lowering oxygen vacancy, enlarge a process margin and achieve high characteristic stabilities in a later process, a display element having such a field effect transistor, an image display device having such display elements, and a system having such an image display device. With this configuration, inter-element characteristic variations in a panel are reduced, and thus, the field effect transistor capable of displaying high definition and high quality images on a large-size screen, a display element having the field effect transistor, an image display device having the display element, and a system having the image display device may be provided.

EXAMPLES

Specific Examples 1 through 23 and Comparative Examples 1 and 2, and evaluations of the field effect transistors fabricated in the Examples 1 through 23 and the Comparative Examples 1 and 2 are described below.

Example 1

An alkali-free glass substrate was ultrasonically cleaned using neutral detergent, deionized water, and isopropyl alcohol. After drying the alkali-free glass substrate, the alkali-free glass substrate was subject to UV-ozone processing at 90° C. for 10 minutes. Mo was deposited on the alkali-free glass substrate with a thickness of 100 nm by DC magnetron sputtering, and the deposited film was then patterned by photolithography to form a gate electrode. Subsequently, $SiO_2$ was deposited with a thickness of 200 nm by RF magnetron sputtering to form a gate insulator film. Al-doped $MgIn_2O_4$ was deposited to forth an active layer film with a thickness of 100 nm by DC magnetron sputtering via a metal mask, using a $Mg_{0.99}Al_{0.01}In_2O_4$ sintered body target. An argon gas and an oxygen gas were introduced as a sputtering gas. The total pressure was fixed at 1.1 Pa, and oxygen concentration was varied in a range of 1.2 to 10% as a parameter. Next, Al was deposited by vacuum evaporation via a metal mask to form source and drain electrodes with thicknesses of 100 nm. A channel length was 50 μm, and a channel width was 400 μm. Finally, annealing was carried out in air at 300° C. for one hour, thereby fabricating a field effect transistor.

Examples 2 to 9

In the field effect transistor fabrication processes for Examples 2 to 9, field effect transistors were fabricated in the same manner as Example 1, except that a sintered body target used in the active layer fabrication process was changed to those listed in Table 1.

Comparative Example 1

In the field effect transistor fabrication process for Comparative Example 1, a field effect transistor was fabricated in the same manner as Example 1, except that sintered body target used in the active layer fabrication process was changed to that listed in Table 1. Note that Table 1 also illustrates evaluation results of the mobility of the field effect transistor when the oxygen concentration was 2% and 6% in the active layer deposition process.

TABLE 1

| | Sputtering target | Mobility [cm²/Vs] in 2% oxygen concentration | Mobility [cm²/Vs] in 6% oxygen concentration |
|---|---|---|---|
| Example 1 | $Mg_{0.99}Al_{0.01}In_2O_4$ | 6.36 | 6.38 |
| Example 2 | $MgIn_{1.98}Sn_{0.02}O_4$ | 6.55 | 6.48 |
| Example 3 | $Zn_{1.98}Al_{0.02}O_4$ | 3.84 | 3.92 |
| Example 4 | $Zn_2Ti_{0.99}Nb_{0.01}O_4$ | 3.56 | 3.43 |
| Example 5 | $Y_{0.6}In_{1.39}W_{0.01}O_3$ | 5.73 | 5.85 |
| Example 6 | $La_{0.6}In_{1.39}Ta_{0.01}O_3$ | 5.53 | 5.47 |
| Example 7 | $Mg_{0.7}Zn_{0.3}In_{1.99}W_{0.01}O_4$ | 4.58 | 4.45 |
| Example 8 | $Mg_{0.8}Cd_{0.19}Nb_{0.01}In_2O_4$ | 6.88 | 6.79 |
| Example 9 | $MgIn_{0.8}Ga_{0.19}Mo_{0.01}O_4$ | 3.69 | 3.54 |
| Comparative Example 1 | $MgIn_2O_4$ | 4.93 | 3.08 |

Example 10

An alkali-free glass substrate was ultrasonically cleaned using neutral detergent, deionized water, and isopropyl alcohol. After drying the alkali-free glass substrate, the alkali-free glass substrate was subject to UV-ozone processing at 90° C. for 10 minutes. Mo was deposited on the alkali-free glass substrate with a thickness of 100 nm by DC magnetron sputtering, and the deposited film was then patterned by photolithography to form a gate electrode. Subsequently, $SiO_2$ was deposited with a thickness of 200 nm by RF magnetron sputtering to form a gate insulator film. Nb-doped $CdAl_2O_4$ was deposited to form an active layer film with a thickness of 50 nm by DC magnetron sputtering via a metal mask, using a $Cd_{0.99}Nb_{0.01}Al_2O_4$ sintered body target. An argon gas and an oxygen gas were introduced as a sputtering gas. The total pressure was fixed at 1.1 Pa, and oxygen concentration was varied in a range of 60 to 100% as a parameter. Next, Al was deposited by vacuum evaporation via a metal mask to form source and drain electrodes with thicknesses of 100 nm. A channel length was 50 μm, and a channel width was 400 μm. Finally, annealing was carried out in oxygen atmosphere at 200° C. for one hour, thereby fabricating a field effect transistor.

Examples 11 to 23

In the field effect transistor fabrication processes for Examples 11 to 23, field effect transistors were fabricated in the same manner as Example 10, except that a sintered body target used in the active layer fabrication process was changed to those listed in Table 2.

Comparative Example 2

In the field effect transistor fabrication process for Comparative Example 2, a field effect transistor was fabricated in the same manner as Example 10, except that a sintered body target used in the active layer fabrication process was changed to that listed in Table 2. Note that Table 2 also illustrates evaluation results of the mobility of the field effect transistor when the oxygen concentration was 60% and 100% in the active layer deposition process.

TABLE 2

| | Sputtering target | Mobility [cm$^2$/Vs] in 60% oxygen concentration | Mobility [cm$^2$/Vs] in 100% oxygen concentration |
|---|---|---|---|
| Example 10 | $Cd_{0.99}Nb_{0.01}Al_2O_4$ | 1.35 | 1.26 |
| Example 11 | $CdGa_{1.98}Ge_{0.02}O_4$ | 1.55 | 1.53 |
| Example 12 | $Zn_{0.99}Mo_{0.01}In_2O_4$ | 1.12 | 1.24 |
| Example 13 | $CdIn_{1.99}Ta_{0.01}O_4$ | 2.47 | 2.58 |
| Example 14 | $ZnIn_{1.98}W_{0.02}O_4$ | 1.23 | 1.29 |
| Example 15 | $Cd_{0.7}Zn_{0.29}Mo_{0.01}In_2O_4$ | 2.25 | 2.18 |
| Example 16 | $CdMg_{0.99}In_{0.01}SnO_4$ | 1.83 | 1.77 |
| Example 17 | $Zn_2Sn_{0.99}Ta_{0.01}O_4$ | 1.67 | 1.59 |
| Example 18 | $Cd_{1.99}Y_{0.01}Sb_2O_7$ | 2.03 | 2.14 |
| Example 19 | $ZnSb_{1.98}Mo_{0.02}O_6$ | 1.12 | 1.35 |
| Example 20 | $Cd_2Ge_{0.98}Nb_{0.02}O_4$ | 1.92 | 1.87 |
| Example 21 | $Cd_{0.99}Y_{0.01}Sb_2O_6$ | 1.79 | 1.84 |
| Example 22 | $In_{1.99}W_{0.01}Zn_2O_5$ | 1.03 | 1.18 |
| Example 23 | $In_2Zn_{2.99}Nb_{0.01}O_6$ | 1.14 | 1.06 |
| Comparative Example 2 | $ZnIn_2O_4$ | 1.05 | 0.63 |

Evaluation Result

Figure 16:
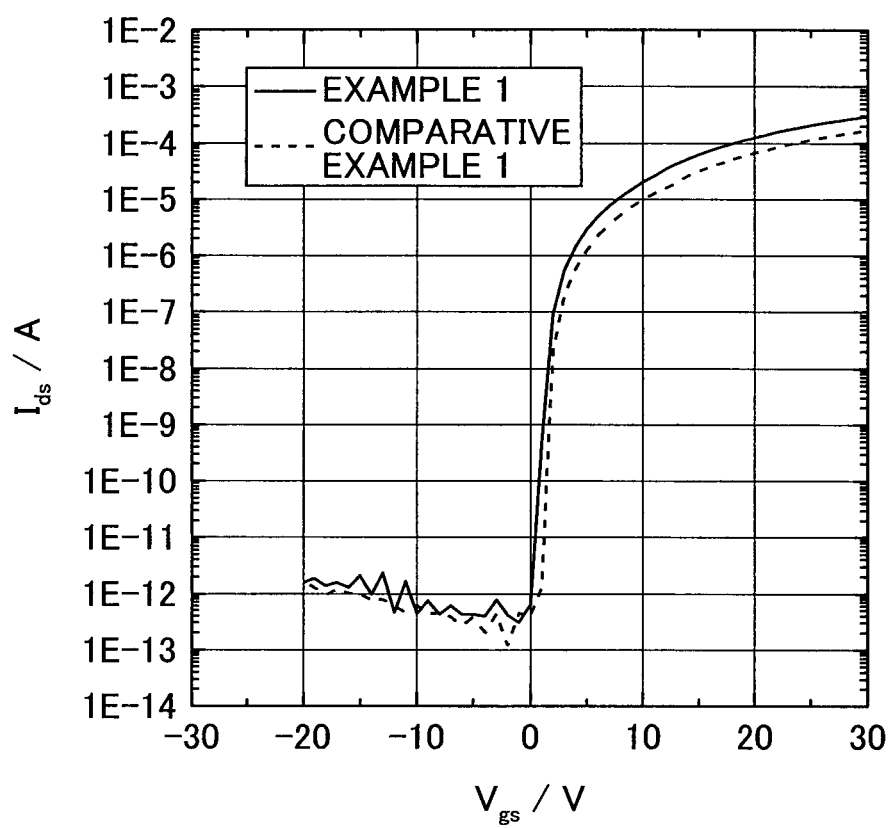
FIG. 16 is a diagram illustrating characteristics of the field effect transistors in Example 1 and Comparative Example 1.

FIG. 16 illustrates transfer characteristics (Vds=20 V) of the field effect transistors fabricated in Example 1 and Comparative Example 1. Excellent characteristics including a rising on-voltage (Von) of 0 V, mobility of 6.4 cm$^2$/Vs, an 8-digit On-Off ratio were obtained in Example 1 where Al was doped in the active layer. On the other hand, a rising on-voltage (Von) of 1 V, mobility of 3.1 cm$^2$/Vs, an 8-digit On-Off ratio were obtained in Comparative Example 1, where Al was not doped in the active layer. Compared to Example 1, the rising on-voltage is shifted to a plus side and the mobility becomes lower in Comparative Example 1. This may result from the fact that the carrier concentration in Comparative Example 1 was higher than that of Example 1.

Figure 17:
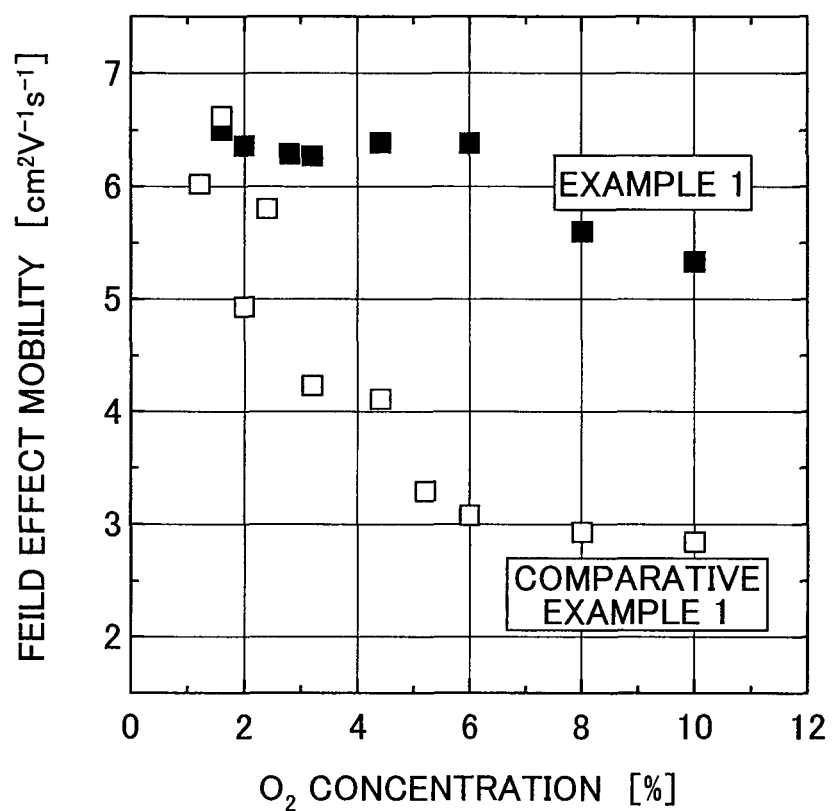
FIG. 17 is a diagram illustrating a relationship between oxygen concentration while deposition and field effect mobility in the characteristics of the field effect transistor in Example 1 and Comparative Example 1 while deposition.

FIG. 17 illustrates a relationship between the oxygen concentration of the deposition condition and the field effect mobility of the field effect transistors fabricated in Example 1 and Comparative Example 1 with deposition. As illustrated in FIG. 17, in Example 1, the field effect mobility was approximately 6.4 cm$^2$/Vs, which was constant in the oxygen concentration range of 1.6 to 6.0%; however, the field effect mobility was slightly decreased in the oxygen concentration of 8% or more. On the other hand, in Comparative Example 1, the field effect mobility was approximately the same as Example 1 at the oxygen concentration of 1.6%; however, the field effect mobility was decreased with the increase of the oxygen concentration. The field effect mobility obtained at the oxygen concentration of 6% was decreased to approximately half of that obtained at the oxygen concentration of 1.6%. In Example 1, since n-type doping was carried out by introducing Al, carriers were generated from Al that substituted for Mg. Thus, the field effect mobility was kept constant even if the oxygen concentration was increased. By contrast, in Comparative Example 1, since the doping was not carried out, the oxygen vacancy in the active layer was decreased with the increase of the oxygen concentration. Thus, the carrier concentration was decreased to increase the contact resistance in the interface between the source and drain electrodes and the active layer, thereby lowering the field effect mobility.

Similarly, no change was observed in the field effect mobility at the oxygen concentration of 2% and 6% in Examples 2 through 9, as illustrated in Table 1. That is, a substituted cation may have served as an n-type dopant to generate electron carriers, so that certain characteristics were observed regardless of levels of the oxygen concentration.

Further, as illustrated in Table 2, the field effect mobility was decreased by approximately 40% when the oxygen concentration was increased from 60 to 100% in Comparative Example 2; however, the field effect mobility was not decreased when the oxygen concentration was increased from 60 to 100% in Examples 10 through 23. That is, a substituted cation may have served as an n-type dopant to generate electron carriers, so that certain characteristics were observed regardless of levels of the oxygen concentration.

That is, the field effect transistor having the oxide semiconductor as the active layer, in which the cations were used for the substitutional doping to generate electron carriers, exhibits excellent characteristics of high field effect mobility and normally-off in a wider process range compared to the field effect transistor having the oxide semiconductor, in which the oxygen concentration alone was controlled to generate electron carriers.

According to one embodiment, there is provided a field effect transistor that includes a gate electrode to which a gate voltage is applied; a source electrode and a drain electrode for acquiring a current in response to the gate voltage; an active layer provided adjacent to the source electrode and the drain electrode, the active layer being formed of an n-type oxide semiconductor; and a gate insulator layer provided between the gate electrode and the active layer. In the field effect transistor, the n-type oxide semiconductor is formed of an n-type doped compound having a chemical composition of a crystal phase obtained by introducing at least one of a trivalent cation, a tetravalent cation, a pentavalent cation and a hexavalent cation.

In the field effect transistor, the n-type oxide semiconductor is formed of an n-type doped cubic compound obtained by introducing at least one of a trivalent cation, a tetravalent cation, a pentavalent cation and a hexavalent cation.

In the field effect transistor, the n-type oxide semiconductor is formed of a spinel compound represented by $AB_2O_4$ where A is one or more divalent cations including $Mg^{2+}$, $Zn^{2+}$, and $Cd^{2+}$, and B is one or more trivalent cations including $Al^{3+}$, $Ga^{3+}$, and $In^{3+}$, and the n-type doped compound formed of the spinel compound is obtained by introducing one or more types of cations including $Al^{3+}$, $Ga^{3+}$, $In^{3+}$, $Ge^{4+}$, $Sn^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$ into the one or more divalent cations represented by the A.

In the field effect transistor, the n-type oxide semiconductor is formed of a spinel compound represented by $AB_2O_4$ where A is one or more divalent cations including $Mg^{2+}$, $Zn^{2+}$, and $Cd^{2+}$, and B is one or more trivalent cations including $Al^{3+}$, $Ga^{3+}$, and $In^{3+}$, and the n-type doped compound formed of the spinel compound is obtained by introducing one or more types of cations including $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$ into the one or more trivalent cations represented by B.

In the field effect transistor, the n-type oxide semiconductor is formed of a spinel compound represented by $A_2DO_4$ where A is one or more divalent cations including $Mg^{2+}$, $Zn^{2+}$, and $Cd^{2+}$, and D is one or more tetravalent cations including $Ti^{4+}$, and $Sn^{4+}$, and the n-type doped compound formed of the spinel compound is obtained by introducing one or more types of cations including $Al^{3+}$, $Ga^{3+}$, $In^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$ into the one or more one or more divalent cations represented by A.

In the field effect transistor, the n-type oxide semiconductor is formed of a spinel compound represented by $A_2DO_4$ where A is one or more divalent cations including $Mg^{2+}$, $Zn^{2+}$, and $Cd^{2+}$, and D is one or more tetravalent cations including $Ti^{4+}$, and $Sn^{4+}$, and the n-type doped compound formed of the spinel compound is obtained by introducing one or more types of cations including $V^{5+}$, $Nb^{5+}$, $Ta^{5+}$, $Sb^{5+}$, $Mo^{6+}$, and $W^{6+}$ into the one or more tetravalent cations represented by the D.

In the field effect transistor, the n-type oxide semiconductor is formed of a bixbite compound having one or more of trivalent cations selected from $In^{3+}$, $Sc^{3+}$, $Y^{3+}$, and $Ln^{3+}$ where the Ln is a rare earth element, and the n-type doped compound formed of the bixbite compound is obtained by introducing one or more types of cations including $Al^{3+}$, $Ga^{3+}$, $In^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$.

In the field effect transistor, the n-type oxide semiconductor is formed of an n-type doped tetragonal compound obtained by introducing at least one of a trivalent cation, a tetravalent cation, a pentavalent cation and a hexavalent cation.

In the field effect transistor, the n-type oxide semiconductor is formed of a trirutile compound represented by $AE_2O_6$ where A is one or more divalent cations including $Mg^{2+}$, $Zn^{2+}$, and $Cd^{2+}$, and E is one or more pentavalent cations including $Sb^{5+}$, $Nb^{5+}$, and $Ta^{5+}$, and the n-type doped compound formed of the trirutile compound is obtained by introducing one or more types of cations including $Al^{3+}$, $Ga^{3+}$, $In^{3+}$, $Y^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$.

In the field effect transistor, the n-type oxide semiconductor is formed of an n-type doped orthorhombic compound obtained by introducing at least one of a trivalent cation, a tetravalent cation, a pentavalent cation and a hexavalent cation.

In the field effect transistor, the n-type oxide semiconductor is formed of an olivine compound represented by $A_2GO_4$ where A is one or more divalent cations including $Mg^{2+}$, $Zn^{2+}$, and $Cd^{2+}$, and G is one or more tetravalent cations including $Si^{4+}$, $Ge^{4+}$, and $Sn^{4+}$, and the n-type doped compound formed of the olivine compound is obtained by introducing one or more types of cations including $Al^{3+}$, $Ga^{3+}$, $In^{3+}$, $Y^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$.

In the field effect transistor, the n-type oxide semiconductor is formed of an n-type doped hexagonal compound obtained by introducing at least one of a trivalent cation, a tetravalent cation and a hexavalent cation.

In the field effect transistor, the n-type oxide semiconductor is formed of a $PbSb_2O_6$ type compound represented by $RE_2O_6$ where R is one or more divalent cations including $Ca^{2+}$, $Sr^{2+}$, $Ba^{2+}$, $Cd^{2+}$, and $Pb^{2+}$, and E is one or more pentavalent cations including $Sb^{5+}$, $Nb^{5+}$, and $Ta^{5+}$, and the n-type doped compound formed of the $PbSb_2O_6$ type compound is obtained by introducing one or more types of cations including $Al^{3+}$, $Ga^{3+}$, $In^{3+}$, $Y^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$.

In the field effect transistor, the n-type oxide semiconductor is formed of a homologous compound represented by $In_2O_3(ZnO)_m$ where the m is an integer of two to six, and the n-type doped compound formed of the homologous compound is obtained by introducing one or more types of cations including $V^{5+}$, $Nb^{5+}$, $Ta^{5+}$, $Sb^{5+}$, $Mo^{6+}$, and $W^{6+}$.

According to one embodiment, there is provided a display element that includes an optical control element configured to control an optical output based on a driving signal; the field effect transistor; and a drive circuit configured to drive the optical control element.

In the display element, the optical control element includes one of an organic electroluminescent element, an electrochromic element, a liquid crystal element, and an electrophoretic element.

According to one embodiment, there is provided an image display device for displaying images based on image data that includes a plurality of the display elements as claimed in claim 15 arranged in a matrix; a plurality of wires configured to individually apply gate voltages to a plurality of field effect transistors in the display elements arranged in the matrix; and a display control device configured to separately control gate voltages of the field effect transistors via the wires based on the image data.

According to one embodiment, there is provided a system that includes the image display device; and an image data generating device configured to generate the image data based on image information to be displayed and output the generated image data to the image display device.

As described above, the field effect transistor according to the embodiments is suitable for enlarging the process margin and stabilizing the TFT characteristics at high levels. Further, the display element according to the embodiments is suitable for high speed driving and reducing the inter-element variations in the panel so as to improve the reliability. In addition, the image display device according to the embodiments is suitable for displaying images on a large-size screen with high image quality. Moreover, the system according to the embodiments is suitable for displaying image information with high image definition.

Embodiments of the present invention have been described heretofore for the purpose of illustration. The present invention is not limited to these embodiments, but various variations and modifications may be made without departing from the scope of the present invention. The present invention should not be interpreted as being limited to the embodiments that are described in the specification and illustrated in the drawings.

The present application is based on Japanese Priority Application No. 2010-031610 filed on Feb. 16, 2010, and Japanese Priority Application No. 2011-021155 filed on Feb. 2, 2011, with the Japanese Patent Office, the entire contents of which are hereby incorporated by reference.

The invention claimed is:

1. A field effect transistor comprising:
   a gate electrode to which a gate voltage is applied;
   a source electrode and a drain electrode that acquire a current in response to the gate voltage;
   an active layer located adjacent to the source electrode and the drain electrode, the active layer comprising a metal oxide semiconductor of n-type; and
   a gate insulator layer located between the gate electrode and the active layer,
   wherein the metal oxide semiconductor comprises an n-type substitutional doped oxide with a crystal composition, wherein the n-type doped compound comprises at least one dopant wherein all dopant valences are larger than that of a valence of a metal in the metal oxide semiconductor for which the dopant is being substitutionally doped.

2. The field effect transistor of claim 1,
   wherein the n-type substitutional doped oxide with the crystal composition has a composition of a cubic crystal system.

3. The field effect transistor of claim 2,
   wherein the cubic crystal system is a spinel compound represented by $AB_2O_4$ where A is at least one divalent cation selected from the group consisting of $Mg^{2+}$, $Zn^{2+}$, and $Cd^{2+}$, and B is at least one trivalent cation selected from the group consisting of $Al^{3+}$, $Ga^{3+}$, and $In^{3+}$.

4. The field effect transistor of claim 3, wherein the spinel compound is selected from the group consisting of $MgGa_2O_4$, $MgIn_2O_4$, $ZnAl_2O_4$, $ZnGa_2O_4$, and $CdGa_2O_4$.

5. The field effect transistor of claim 3,
   wherein a part of the cation A of $AB_2O_4$ of the spinel compound is substituted by at least one cation selected from the group consisting of $Al^{3+}$, $Ga^{3+}$, $In^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$.

6. The field effect transistor of claim 3,
   wherein a part of the cation B of $AB_2O_4$ of the spinel compound is substituted by at least one cation selected from the group consisting of $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$.

7. The field effect transistor of claim 2,
   wherein the cubic crystal system is a spinel compound represented by $A_2DO_4$ where A is at least one divalent cation selected from the group consisting of $Mg^{2+}$, $Zn^{2+}$, and $Cd^{2+}$, and D is at least one tetravalent cation selected from the group consisting of $Ti^{4+}$, and $Sn^{4+}$.

8. The field effect transistor of claim 7, wherein the spinel compound is selected from the group consisting of $Mg_2SnO_4$, $Zn_2TiO_4$, $Zn_2SnO_4$, and $Cd_2SnO_4$.

9. The field effect transistor of claim 7,
   wherein a part of the cation A of $A_2DO_4$ of the spinel compound is substituted by at least one cation selected from the group consisting of $Al^{3+}$, $Ga^{3+}$, $In^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$.

10. The field effect transistor of claim 7,
    wherein a part of the cation D of $A_2DO_4$ of the spinel compound is substituted by at least one cation selected from the group consisting of $V^{5+}$, $Nb^{5+}$, $Ta^{5+}$, $Sb^{5+}$, $Mo^{6+}$, and $W^{6+}$.

11. The field effect transistor of claim 2,
    wherein the cubic crystal system is a bixbite compound comprising at least one trivalent cation selected from the group consisting of $In^{3+}$, $SC^{3+}$, $Y^{3+}$, and $Ln^{3+}$, where Ln is a rare earth element.

12. The field effect transistor of claim 11, wherein the bixbite compound is selected from the group consisting of $In_2O_3$, $Y_2O_3$, and $La_2O_3$.

13. The field effect transistor of claim 11,
    wherein a part of the trivalent cation of the bixbite compound is substituted by at least one cation selected from the group consisting of $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$.

14. The field effect transistor of claim 1,
    wherein the crystal composition has a composition of an orthorhombic crystal system.

15. The field effect transistor of claim 14,
    wherein the orthorhombic crystal system is an olivine compound represented by $A_2GO_4$ where A is at least one divalent cation selected from the group consisting of $Mg^{2+}$, $Zn^{2+}$, and $Cd^{2+}$, and G is at least one tetravalent cation selected from the group consisting of $Si^{4+}$, $Ge^{4+}$, and $Sn^{4+}$.

16. The field effect transistor of claim 15,
    wherein a part of the cation A of $A_2GO_4$ of the olivine compound is substituted by at least one cation selected from the group consisting of $Al^{3+}$, $Ga^{3+}$, $In^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$.

17. The field effect transistor of claim 15,
    wherein a part of the cation G of $A_2GO_4$ of the olivine compound is substituted by at least one cation selected from the group consisting of $V^{5+}$, $Nb^{5+}$, $Ta^{5+}$, $Sb^{5+}$, $Mo^{6+}$, and $W^{6+}$.

18. The field effect transistor of claim 15, wherein the olivine compound is selected from $Cd_2GeO_4$, $Mg_2GeO_4$.

19. The field effect transistor of claim 1,
    wherein the crystal composition has a composition of a hexagonal crystal system.

20. The field effect transistor of claim 19,
    wherein the hexagonal crystal system is a homologous compound represented by $In_2O_3(ZnO)_m$ where m is an integer of two to six.

21. The field effect transistor of claim 20,
    wherein a part of the cation of the homologous compound is substituted by at least one cation selected from the group consisting of $V^{5+}$, $Nb^{5+}$, $Ta^{5+}$, $Sb^{5+}$, $Mo^{6+}$, and $W^{6+}$.

22. The field effect transistor of claim 20, wherein the homologous compound is selected from $In_2Zn_2O_5$.

23. The field effect transistor of claim 19,
    wherein the hexagonal crystal system is a $PbSb_2O_6$ type compound represented by $RE_2O_6$ where R is at least one divalent cation selected from the group consisting of $Ca^{2+}$, $Sr^{2+}$, $Ba^{2+}$, $Cd^{2+}$, and $Pb^{2+}$, and E is at least one pentavalent cation selected from the group consisting of $Sb^{5+}$, $Nb^{5+}$, and $Ta^{5+}$.

24. The field effect transistor of claim 23,
    wherein a part of the cation R of $RE_2O_6$ of the $PbSb_2O_6$ type compound is substituted by at least one cation selected from the group consisting of $Al^{3+}$, $Ga^{3+}$, $In^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$.

25. The field effect transistor of claim 23,
    wherein a part of the cation E of $RE_2O_6$ of the $PbSb_2O_6$ type compound is substituted by at least one cation selected from the group consisting of $Mo^{6+}$, and $W^{6+}$.

26. The field effect transistor of claim 23, wherein the $PbSb_2O_6$ type compound is selected from $PbSb_2O_6$, $CdSb_2O_6$.

27. A display element comprising:
an optical control element configured to control an optical output based on a driving signal;
the field effect transistor of claim 1; and
a drive circuit configured to drive the optical control element.

28. The display element of claim 27,
wherein the optical control element comprises an element selected from the group consisting of an organic electroluminescent element, an electrochromic element, a liquid crystal element, and an electrophoretic element.

29. An image display device comprising:
a plurality of the display elements of claim 27 arranged in a matrix;
a plurality of wires configured to individually apply gate voltages to a plurality of field effect transistors in the display elements arranged in the matrix; and
a display control device configured to separately control gate voltages of the field effect transistors via the wires based on image data.

30. A system comprising:
the image display device of claim 29; and
an image data generating device configured to generate the image data based on image information to be displayed and output the generated image data to the image display device.

31. The field effect transistor of claim 2,
wherein the n-type substitutional doped oxide with the composition of the cubic crystal system is a pyrochlore compound represented by $J_2E_2O_7$ where J is at least one divalent cation selected from the group consisting of $Ca^{2+}$, $Zn^{2+}$, and $Cd^{2+}$, and E is at least one pentavalent cation including $Sb^{5+}$, $Nb^{5+}$, and $Ta^{5+}$.

32. The field effect transistor of claim 31,
wherein a part of the cation J of $J_2E_2O_7$ of the pyrochlore compound is substituted by at least one cation selected from the group consisting of $Al^{3+}$, $Ga^{3+}$, $In^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$.

33. The field effect transistor of claim 31,
wherein a part of the cation E of $J_2E_2O_7$ of the pyrochlore compound is substituted by at least one cation selected from the group consisting of $Mo^{6+}$, and $W^{6+}$.

34. The field effect transistor of claim 31, wherein the pyrochlore compound is selected from $Cd_2Sb_2O_7$.

35. A field effect transistor, comprising:
a gate electrode to which a gate voltage is applied;
a source electrode and a drain electrode that acquire a current in response to the gate voltage;
an active layer located adjacent to the source electrode and the drain electrode, the active layer comprising a metal oxide semiconductor of n-type; and
a gate insulator layer located between the gate electrode and the active layer,
wherein the metal oxide semiconductor comprises an n-type substitutional doped oxide with a composition of a tetragonal crystal system, wherein the n-type doped compound comprises at least one dopant selected from the group consisting of a trivalent cation, a tetravalent cation, a pentavalent cation and a hexavalent cation,
wherein the tetragonal crystal system is a trirutile compound represented by $AE_2O_6$ where A is at least one divalent cation selected from the group consisting of $Mg^{2+}$, $Zn^{2+}$, and $Cd^{2+}$, and E is at least one pentavalent cation selected from the group consisting of $Sb^{5+}$, $Nb^{5+}$, and $Ta^{5+}$, and
wherein the n-type doped compound comprises at least one cation selected from the group consisting of $Al^{3+}$, $Ga^{3+}$, $In^{3+}$, $Y^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$, and
wherein the valence of the dopant is larger than that of a valence of a metal in the metal oxide semiconductor for which it is being substitutionally doped.

36. The field effect transistor of claim 34, wherein the trirutile compound is selected from the group consisting of $ZnSb_2O_6$, $MgSb_2O_6$, and $MgTa_2O_6$.

37. The field effect transistor of claim 35,
wherein a part of the cation A of $AE_2O_6$ of the trirutile compound is substituted by at least one cation selected from the group consisting of $Al^{3+}$, $Ga^{3+}$, $In^{3+}$, $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, and $W^{6+}$.

38. The field effect transistor of claim 35,
wherein a part of the cation E of $AE_2O_6$ of the trirutile compound is substituted by at least one cation selected from the group consisting of $Mo^{6+}$, and $W^{6+}$.

* * * * *